(12) United States Patent
Fang et al.

(10) Patent No.: US 10,593,630 B2
(45) Date of Patent: Mar. 17, 2020

(54) SEMICONDUCTOR PACKAGE AND METHOD FOR MANUFACTURING THE SAME

(71) Applicant: Advanced Semiconductor Engineering, Inc., Kaohsiung (TW)

(72) Inventors: Hsu-Nan Fang, Kaohsiung (TW); Chun-Jun Zhuang, Kaohsiung (TW); Yung I. Yeh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/978,070

(22) Filed: May 11, 2018

(65) Prior Publication Data

US 2019/0348371 A1   Nov. 14, 2019

(51) Int. Cl.
*H01L 21/66* (2006.01)
*H01L 23/552* (2006.01)
*H01L 23/31* (2006.01)
*H01L 23/00* (2006.01)
*H01L 21/56* (2006.01)

(52) U.S. Cl.
CPC ............ *H01L 23/552* (2013.01); *H01L 21/56* (2013.01); *H01L 23/3157* (2013.01); *H01L 24/17* (2013.01); *H01L 2224/02372* (2013.01); *H01L 2224/02373* (2013.01)

(58) Field of Classification Search
CPC ................................................ H01L 2924/181
See application file for complete search history.

(56) References Cited

U.S. PATENT DOCUMENTS

| 7,476,980 | B2 | 1/2009 | Rebibis et al. |
| 9,761,571 | B2 | 9/2017 | Scanlan |
| 2011/0095403 | A1* | 4/2011 | Lee ..................... H01L 21/4857 257/660 |
| 2011/0186973 | A1* | 8/2011 | Pagaila ................. H01L 23/552 257/660 |
| 2011/0186977 | A1* | 8/2011 | Chi ......................... H01L 21/78 257/686 |
| 2012/0187545 | A1* | 7/2012 | Khan .................... H01L 21/561 257/621 |
| 2012/0241955 | A1* | 9/2012 | Law ........................ H01L 24/81 257/738 |
| 2016/0260695 | A1* | 9/2016 | Chung .................. H01L 25/105 |
| 2017/0330839 | A1 | 11/2017 | Kim et al. |
| 2018/0060479 | A1* | 3/2018 | Lo ........................ G06F 17/5081 |
| 2019/0067233 | A1* | 2/2019 | Pachamuthu ........... H01L 24/05 |
| 2019/0139845 | A1* | 5/2019 | Lin ....................... H01L 21/565 |

* cited by examiner

*Primary Examiner* — Thao P Le
(74) *Attorney, Agent, or Firm* — Foley & Lardner LLP

(57) ABSTRACT

A semiconductor package includes a semiconductor die, a plurality of conductive bumps, a shielding layer, an encapsulant and a redistribution layer. The semiconductor die has an active surface, a backside surface and a lateral surface. The conductive bumps are disposed on the active surface of the semiconductor die. The shielding layer is disposed on the lateral surface of the semiconductor die. The encapsulant covers the shielding layer, and has a first surface and a second surface opposite to the first surface. The redistribution layer is disposed on the first surface of the encapsulant and electrically connected to the semiconductor die through the conductive bumps. The shielding layer is electrically connected to the redistribution layer.

20 Claims, 36 Drawing Sheets

SEMICONDUCTOR PACKAGE AND METHOD FOR MANUFACTURING THE SAME

BACKGROUND

1. Field of the Disclosure

The present disclosure relates to a semiconductor package and a manufacturing method, and to a semiconductor package including a shielding layer disposed on a lateral surface of a semiconductor die, and a method for manufacturing the semiconductor package.

2. Description of the Related Art

A package level shielding process of a semiconductor package includes disposing a semiconductor die on a substrate, forming an encapsulant on the substrate to cover the semiconductor die, forming a trench through the encapsulant to expose a portion of a redistribution layer (RDL) of the substrate, and then forming a shielding layer covering the encapsulant and connecting the portion of the redistribution layer for grounding purpose. In the aforementioned process, the depth of the trench should be controlled precisely to expose the redistribution layer of the substrate. Besides, since the shielding layer covers the entire encapsulant, such process is provided with a low production rate.

SUMMARY

In some embodiments, a semiconductor package includes a semiconductor die, a plurality of conductive bumps, a shielding layer, an encapsulant and a redistribution layer. The semiconductor die has an active surface, a backside surface and a lateral surface. The conductive bumps are disposed on the active surface of the semiconductor die. The shielding layer is disposed on the lateral surface of the semiconductor die. The encapsulant covers the shielding layer, and has a first surface and a second surface opposite to the first surface. The redistribution layer is disposed on the first surface of the encapsulant and electrically connected to the semiconductor die through the conductive bumps. The shielding layer is electrically connected to the redistribution layer.

In some embodiments, a method for manufacturing a semiconductor package includes (a) providing a semiconductor element including a plurality of conductive bumps; (b) forming a protection layer to cover the conductive bumps; (c) singulating the protection layer; and (d) forming a shielding layer on a lateral surface of the protection layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
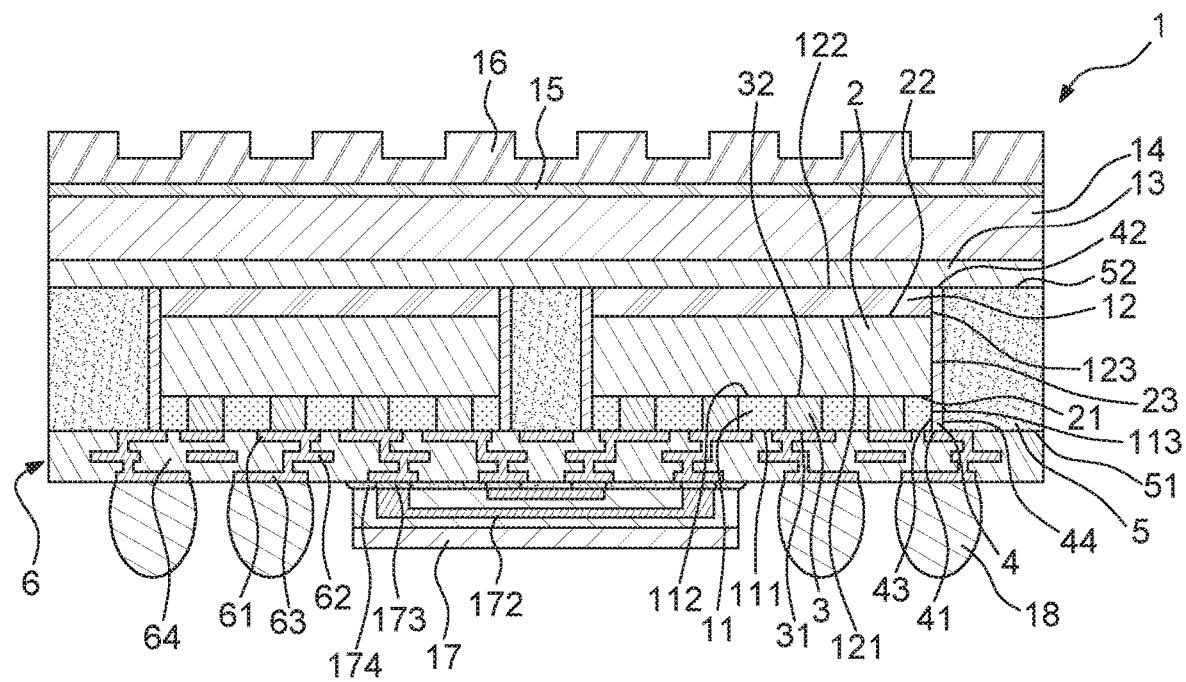
FIG. 1 illustrates a cross-sectional view of a semiconductor package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a package level shielding process, a semiconductor die is disposed on a substrate, and an encapsulant is then formed to cover the substrate and the semiconductor die. Then, a sawing process is conducted to form a trench on the encapsulant, such that a redistribution layer of the substrate can be exposed from the encapsulant. Thus, a shielding layer can be formed to cover the encapsulant and the semiconductor die, and can be electrically connected to the redistribution layer for electromagnetic shielding purpose.

However, in the sawing process, the depth of the trench should be controlled precisely. A trench with an insufficient depth cannot expose the redistribution layer, thus the shielding layer formed thereafter cannot be grounded. On the other hand, a trench with an excess depth may damage the redistribution layer, resulting in failure of the redistribution layer. In some embodiments, the sawing process may be accomplished by a blade, thus, it is difficult to control the depth of the trench precisely. In some embodiments, the sawing process may be accomplished by a laser, and a stop layer is disposed in the substrate to stop the laser. Usually, the stop layer is a portion of the outermost metal layer (e.g., outermost redistribution layer). However, the thickness of the outermost metal layer may be about 10 μm or less, which may be not thick enough to stop the laser. In addition, the warpage of the substrate may be greater than 3 mm. Thus, the laser beam having a consistent energy may cause different depths of trenches. That is, some trenches may not extend through the encapsulant, and some trenches may extend through the outermost metal layer. Further, since the shielding layer covers the entire encapsulant, which has a surface area larger than the semiconductor die, the production rate of the above process is relatively low. Furthermore, the shielding layer is formed by sputtering. However, the trench may have an aspect ratio, defined as the ratio of the depth to width, of greater than 8; thus, the yield rate of the sputtering may be less than 50%.

The present disclosure addresses at least the above concerns and provides for an improved semiconductor package, and improved techniques for manufacturing the semiconductor package. In the semiconductor package, a shielding layer is disposed on a lateral surface of a semiconductor die. Thus, the aforementioned sawing process of the encapsulant can be omitted. Since the shielding layer covers merely the semiconductor die, which has a surface area smaller than the encapsulant, the production rate of the semiconductor package can be increased.

FIG. 1 illustrates a cross-sectional view of a semiconductor package 1 according to some embodiments of the present disclosure. The semiconductor package 1 includes at least one semiconductor die 2, a plurality of conductive bumps 3, a protection layer 11, a first adhesive layer 12, a shielding layer 4, an encapsulant 5, a redistribution layer 6, an electrical component 17, a plurality of connecting elements 18, a metal layer 13, a supporting layer 14, a second adhesive layer 15 and a heat sink 16.

The semiconductor die 2 has an active surface 21, a backside surface 22 opposite to the active surface 21, and a lateral surface 23 extending between the active surface 21 and the backside surface 22. FIG. 1 shows two semiconductor dice 2 in the semiconductor package 1. However, the semiconductor package 1 may include less than two or more than two semiconductor dice 2. Besides, these semiconductor dice 2 can be the same as or different from each other.

The conductive bumps 3 are disposed on the active surface 21 of the semiconductor die 2 and are electrically connected to the semiconductor die 2. FIG. 1 shows four conductive bumps 3 on each semiconductor die 2. However, the amount of the conductive bumps 3 is not limited thereto. The conductive bumps 3 may be pillars or posts made of conductive material, such as copper. Each of the conductive bumps 3 includes a first end 31 and a second end 32 opposite to the first end 31. The second end 32 is disposed on and contacts the active surface 21 of the semiconductor die 2. The first ends 31 of these conductive bumps 3 may be coplanar with each other.

The protection layer 11 is disposed on the active surface 21 of the semiconductor die 2 and covers the conductive bumps 3. For example, the protection layer 11 surrounds and contacts the periphery surface of each of the conductive bumps 3. The protection layer 11 has a first surface 111, a second surface 112 opposite to the first surface 111, and a lateral surface 113 extends between the first surface 111 and the second surface 112. The second surface 112 is disposed on and contacts the active surface 21 of the semiconductor die 2. In some embodiments, the first surface 111 of the protection layer 11 is coplanar with the first end 31 of at least one of the conductive bumps 3. The lateral surface 113 of the protection layer 11 is coplanar with the lateral surface 23 of the semiconductor die 2. A material of the protection layer 11 may be selected from cured photoimageable dielectric (PID) materials, such as an epoxy or a PI including photoinitiators, or other resin materials.

The first adhesive layer 12 is disposed on the backside surface 22 of the semiconductor die 2. The first adhesive layer 12 has a first surface 121, a second surface 122 opposite to the first surface 121, and a lateral surface 123 extending between the first surface 121 and the second surface 122. The first surface 121 is disposed on and contacts the backside surface 22 of the semiconductor die 2. The lateral surface 123 of the first adhesive layer 12 is coplanar with the lateral surface 23 of the semiconductor die 2 and/or the lateral surface 113 of the protection layer 11. The first adhesive layer 12 may be a portion of a die attach film (DAF).

The shielding layer 4 is disposed on and covers the lateral surface 23 of the semiconductor die 2. In some embodiments, the shielding layer 4 is also disposed on and covers the lateral surface 113 of the protection layer 11 and/or the lateral surface 123 of the first adhesive layer 12. The shielding layer 4 has a first end 41, a second end 42, an inner surface 43 and an outer surface 44. The second end 42 is opposite to the first end 41. The inner surface 43 and the outer surface 44 extend between the first end 41 and the second end 42. The outer surface 44 is opposite to the inner surface 43. For example, the inner surface 43 of shielding layer 4 contacts the lateral surface 23 of the semiconductor die 2, the lateral surface 113 of the protection layer 11 and/or the lateral surface 123 of the first adhesive layer 12. In some embodiments, the first end 41 of the shielding layer 4 is coplanar with the first surface 111 of the protection layer 11 and/or the first end 31 of at least one of the conductive bumps 3. The second end 42 of the shielding layer 4 is coplanar with the second surface 122 of the first adhesive layer 12. The shielding layer 4 may be made of a conductive material, such as copper, stainless steel or titanium, and may be formed by sputtering. The shielding layer 4 provides electromagnetic shielding function to the lateral surface 23 of the semiconductor die 2.

The encapsulant 5 covers the shielding layer 4. For example, the encapsulant 5 surrounds and contacts the outer surface 44 of the shielding layer 4. The encapsulant 5 has a first surface 51 and a second surface 52 opposite to the first surface 51. The first surface 51 of the encapsulant 5 is coplanar with the first end 31 of at least one of the conductive bumps 3, the first surface 111 of the protection layer 11, and/or the first end 41 of the shielding layer 4. The second surface 52 of the encapsulant 5 is coplanar with the second surface 122 of the first adhesive layer 12 and/or the second end 42 of the shielding layer 4. A material of the encapsulant 5 may be a molding compound with or without fillers.

The redistribution layer 6 is disposed on the first surface 51 of the encapsulant 5. The redistribution layer 6 may include at least one conductive layer containing traces and pads, and may further include at least one via for connection purpose. A line width/line space (L/S) of the redistribution layer 6 may be about 2 μm/2 μm. For example, FIG. 1 shows the redistribution layer 6 including three conductive layers 61, 62 and 63, which are electrically connected with each other through a plurality of vias. The redistribution layer 6 may further include an insulating structure 64 disposed between these conductive layers 61, 62 and 63. The redistribution layer 6 is electrically connected to the semiconductor die 2 through the conductive bumps 3. For example, at least one of the conductive bumps 3 contacts the topmost conductive layer 61 of the redistribution layer 6. The redistribution layer 6 is also electrically connected to the shielding layer 4. As shown in FIG. 1, the first end 41 of the shielding layer 4 contacts the topmost conductive layer 61 of the redistribution layer 6.

The electrical component 17 and the plurality of connecting elements 18 are electrically connected to the redistribution layer 6, such as electrically connected to the bottommost conductive layer 63 of the redistribution layer 6. The electrical component 17 may be a passive component or another semiconductor die, or an interposer. For example, as shown in FIG. 1, the electrical component 17 is a bridge connector, which includes an inner circuit 172 for electrically connecting the two semiconductor dice 2. The electrical component 17 may further include a plurality of solders 173 for electrical connection with the redistribution layer 6, and an underfill 174 filled between the electrical component 17 and the redistribution layer 6. The connecting elements 18 may be solder bumps that are electrically connected to the bottommost conductive layer 63 of the redistribution layer 6 for external connection purpose.

As shown in FIG. 1, the metal layer 13, the supporting layer 14, the second adhesive layer 15 and the heat sink 16 are sequentially disposed on the second surface 52 of the encapsulant 5. The metal layer 13 may be made of a conductive metal, such as copper. For example, the supporting layer 14 may be a carrier made of silicon, metal or glass, and the metal layer 13 may be a copper film or copper foil disposed on the carrier. The metal layer 13 provides electromagnetic shielding function to the backside surface 22 of the semiconductor die 2. The supporting layer 14 may balance the warpage caused by the insulating structure 64 of the redistribution layer 6 and/or the encapsulant 5. The heat sink 16 is disposed adjacent to the second surface 52 of the encapsulant 5 for heat dissipation purpose and/or warpage balance purpose. For example, the heat sink 16 is attached to the supporting layer 14 through the second adhesive layer 15. The heat sink 16 may be made of a conductive material, such as copper or stainless steel. A material of the second adhesive layer 15 may be any adhesive which is able to attach the heat sink 16 to the supporting layer 14, and may be the same as or different from the material of the first adhesive layer 12.

In the semiconductor package 1, the shielding layer 4 and the metal layer 13 jointly provide electromagnetic shielding function for the semiconductor die 2. Since the shielding layer 4 is formed on and covers the semiconductor die 2 instead of the encapsulant 5, the sawing process for forming the trench on the encapsulant, as described in the package level shielding process above, can be omitted. Besides, since the surface area of the semiconductor die 2 is much less than the surface area of the encapsulant 5, the production rate of the semiconductor package 1 is greater than that of the aforementioned package level shielding process.

Figure 2:
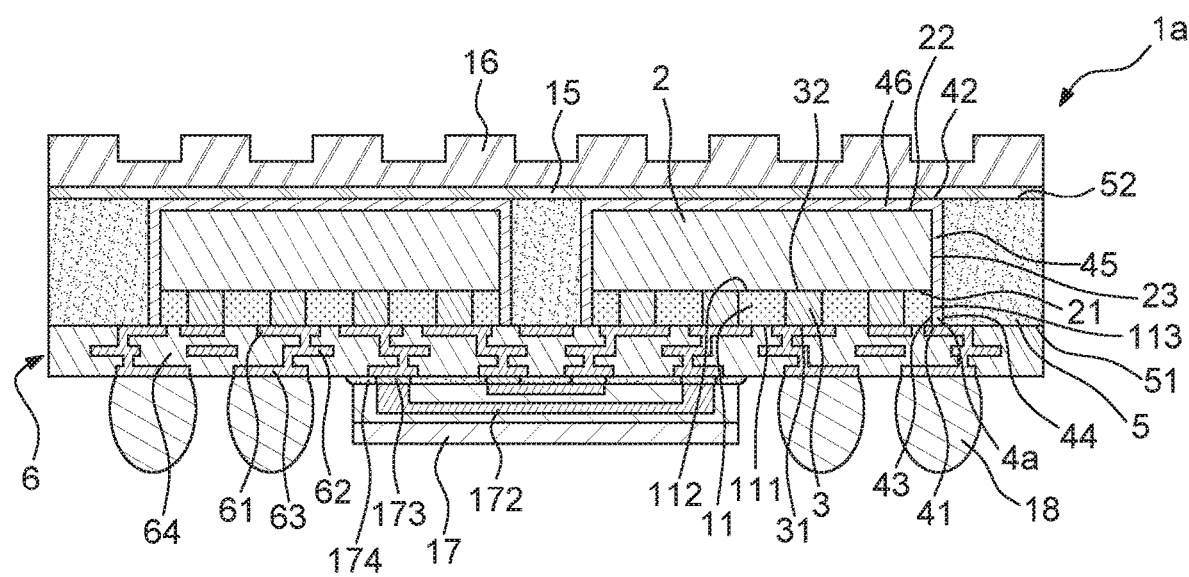
FIG. 2 illustrates a cross-sectional view of a semiconductor package according to some embodiments of the present disclosure.

FIG. 2 illustrates a cross-sectional view of a semiconductor package 1a according to some embodiments of the present disclosure. The semiconductor package 1a is similar to the semiconductor package 1 shown in FIG. 1, except that the first adhesive layer 12, the metal layer 13 and the supporting layer 14 are omitted in the semiconductor package 1a, and the shielding layer 4a of the semiconductor package 1a further covers the backside surface 22 of the semiconductor die 2.

As shown in FIG. 2, the shielding layer 4a includes a side wall 45 and a top wall 46. The side wall 45 has the first end 41, the second end 42, the inner surface 43 and the outer surface 44, which are similar to those of the shielding layer 4 shown in FIG. 1. The side wall 45 is disposed on and covers the semiconductor die 2 and/or the protection layer 11. For example, the inner surface 43 faces and contacts the lateral surface 23 of the semiconductor and/or the lateral surface 113 of the protection layer 11. The first end 41 of the side wall 45 of the shielding layer 4a is coplanar with the first surface 111 of the protection layer 11 and/or the first end 31 of at least one of the conductive bumps 3. The top wall 46 is connected to the second end 42 of the side wall 45. The top wall 46 is disposed on and contacts the backside surface 22 of the semiconductor die 2. In some embodiments, the side wall 45 and the top wall 46 are formed concurrently and integrally. Thus, there is no boundary between the side wall 45 and the top wall 46. In addition, the second surface 52 of the encapsulant 5 is coplanar with a top surface of the top wall 46 of the shielding layer 4a.

As shown in FIG. 2, since the metal layer 13 and the supporting layer 14 are omitted, the second adhesive layer 15 is disposed on and contacts the second surface 52 of the encapsulant 5 and/or the top wall 46 of the shielding layer 46. The heat sink 16 is disposed adjacent to the second surface 52 of the encapsulant 5, and is attached to the encapsulant 5 through the second adhesive layer 15.

In the semiconductor package 1a shown in FIG. 2, the side wall 45 and the top wall 46 of the shielding layer 4a provide electromagnetic function respectively for the lateral surface 23 and the backside surface 22 of the semiconductor die 2.

Figure 3:
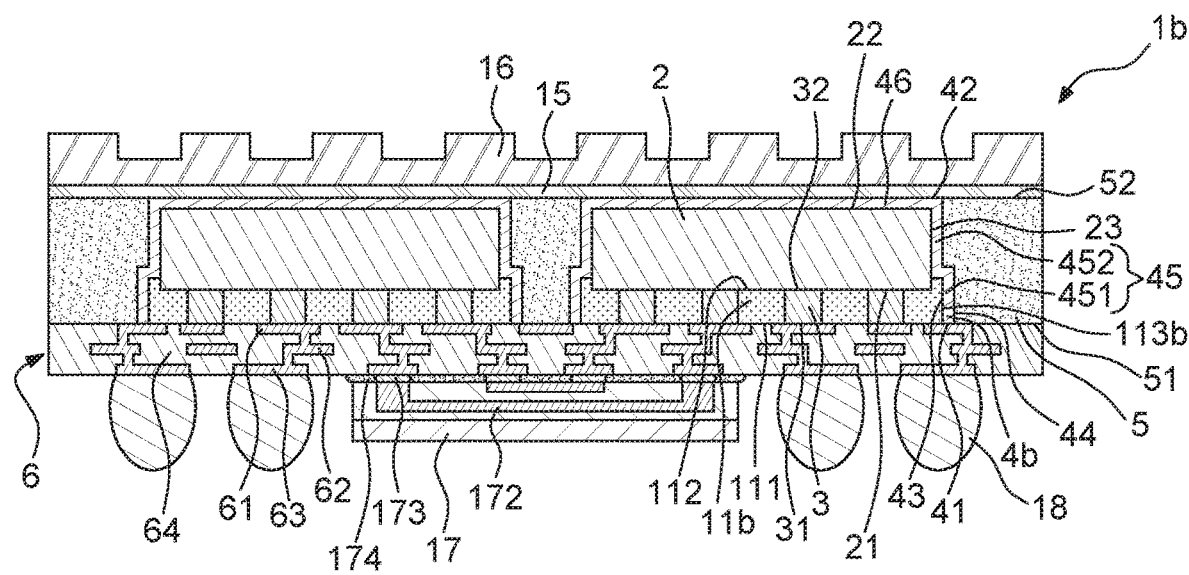
FIG. 3 illustrates a cross-sectional view of a semiconductor package according to some embodiments of the present disclosure.

FIG. 3 illustrates a cross-sectional view of a semiconductor package 1b according to some embodiments of the present disclosure. The semiconductor package 1b is similar to the semiconductor package 1a shown in FIG. 2, except that the lateral surface 113b of the protection layer 11b in the semiconductor package 1b is not coplanar with the lateral surface 23 of the semiconductor die 2, and the side wall 45 of shielding layer 4b of the semiconductor package 1b further includes a first portion 451 and a second portion 452.

As shown in FIG. 3, the protection layer 11b covers the active surface 21 of the semiconductor die 2, and further covers a portion of the lateral surface 23 of the semiconductor die 2. Accordingly, the lateral surface 113b of the protection layer 11b is not coplanar with the lateral surface 23 of the semiconductor die 2. A surface area of the first surface 111 of the protection layer 11b is greater than a surface area of the active surface 21 of the semiconductor die 2.

As shown in FIG. 3, the side wall 45 of the shielding layer 4b includes the first portion 451 and the second portion 452. The first portion 451 includes the first end 41, and the second portion 452 includes the second end 42. The first portion 451 is disposed on and contacts the lateral surface 113b of the protection layer 11b. The second portion 452 is disposed on and contacts the lateral surface 23 of the semiconductor die 2. An area defined by the first portion 451 from a bottom view is greater than an area defined by the second portion 452 from a bottom view.

Figure 4:
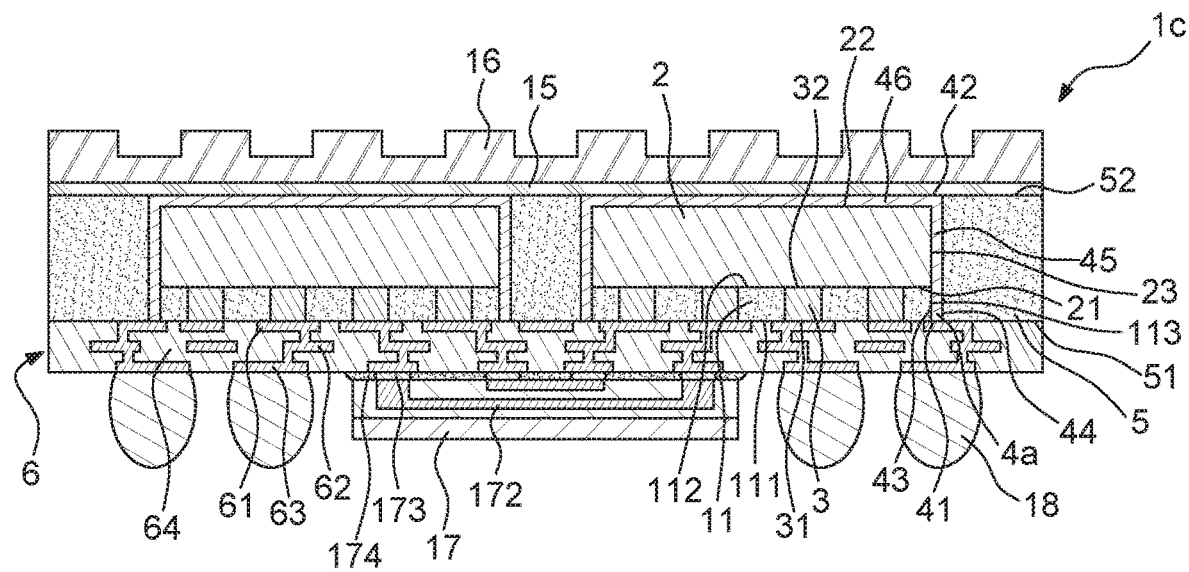
FIG. 4 illustrates a cross-sectional view of a semiconductor package according to some embodiments of the present disclosure.

FIG. 4 illustrates a cross-sectional view of a semiconductor package 1c according to some embodiments of the present disclosure. The semiconductor package 1c is similar to the semiconductor package 1a shown in FIG. 2, except that a material of the protection layer 11 in the semiconductor package 1c is the same as a material of the encapsulant 5, and the protection layer 11 and the encapsulant 5 may be formed concurrently. That is, in the semiconductor package 1c shown in FIG. 4, the protection layer 11 is a portion of the encapsulant 5. In other words, the encapsulant 5 is further disposed on the active surface 21 of the semiconductor die 2 and covers the conductive bumps 3.

Since the encapsulant 5 is further disposed on the active surface 21 of the semiconductor die 2 and surrounds the conductive bumps 3, the reliability of the semiconductor package 1c is improved.

Figure 5:
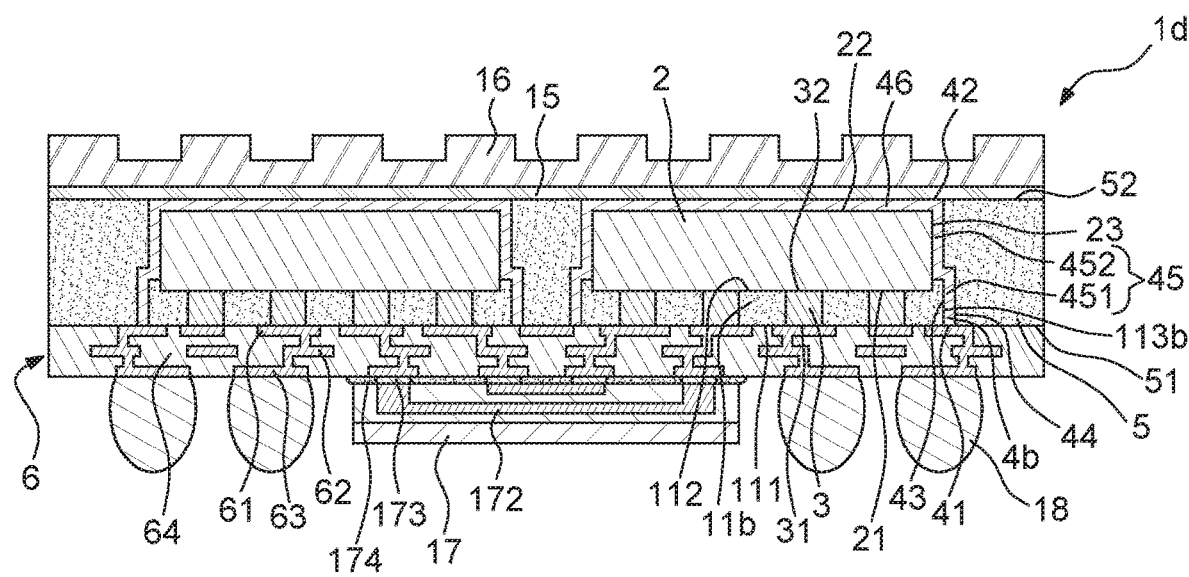
FIG. 5 illustrates a cross-sectional view of a semiconductor package according to some embodiments of the present disclosure.

FIG. 5 illustrates a cross-sectional view of a semiconductor package 1d according to some embodiments of the present disclosure. The semiconductor package 1d is similar to the semiconductor package 1b shown in FIG. 3, except that a material of the protection layer 11b in the semiconductor package 1d is the same as a material of the encapsulant 5, and the protection layer 11b and the encapsulant 5 may be formed concurrently. That is, in the semiconductor package 1d shown in FIG. 5, the protection layer 11b is a portion of the encapsulant 5. In other words, the encapsulant 5 is further disposed on the active surface 21 of the semiconductor die 2 and covers the conductive bumps 3.

FIG. 6 through FIG. 19 illustrate a method for manufacturing a semiconductor package according to some embodiments of the present disclosure. In some embodiments, the method is for manufacturing a semiconductor package such as the semiconductor package 1 shown in FIG. 1.

Figure 6:
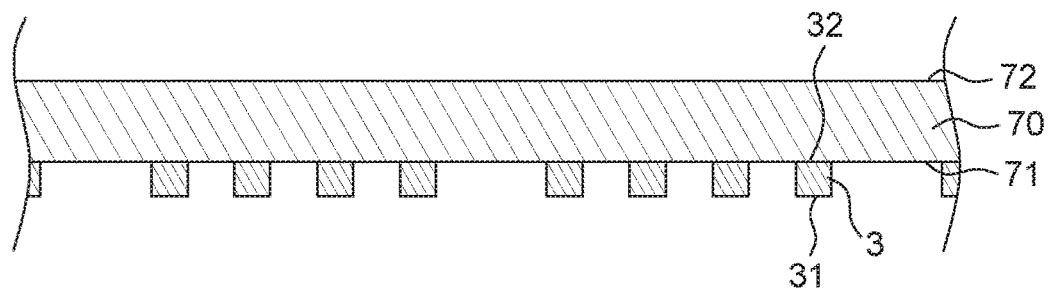
FIG. 6 illustrates one or more stages of a method for manufacturing a semiconductor package according to some embodiments of the present disclosure.

Referring to FIG. 6, a semiconductor element, such as a wafer 70, is provided. The wafer 70 has a first surface 71 and a second surface 72 opposite to the first surface 71. The wafer 70 includes a plurality of conductive bumps 3 disposed on the first surface 71. The conductive bumps 3 may be pillars or posts made of conductive material, such as copper. Each of the conductive bumps 3 includes a first end 31 and a second end 32 opposite to the first end 31. The second end 32 is disposed on and contacts the first surface 71 of the wafer 70. In a later step, the wafer 70 may be separated into a plurality of semiconductor dice 4 (FIG. 9).

Figure 7:
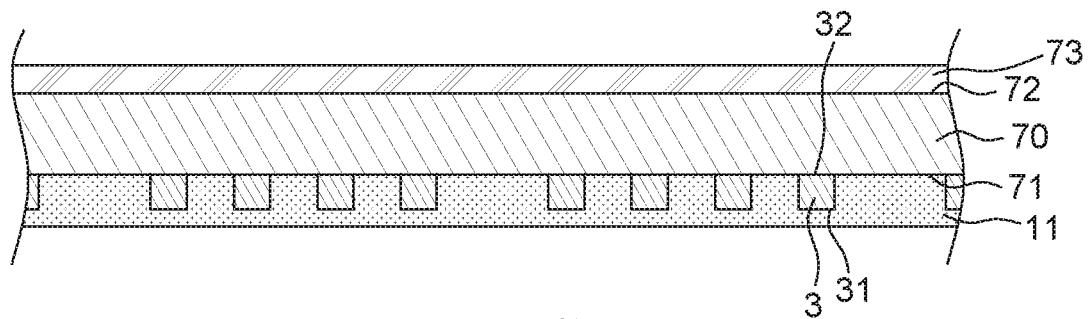
FIG. 7 illustrates one or more stages of a method for manufacturing a semiconductor package according to some embodiments of the present disclosure.

Referring to FIG. 7, the second surface 72 of the wafer 70 is attached to a DAF 73. Then, a protection layer 11 is formed on the first surface 71 of the wafer 70 to cover the conductive bumps 3. The protection layer 11 may be made of cured PID materials, such as an epoxy or a PI including photoinitiators, or other resin materials. As shown in FIG. 7, the first end 31 of each of the conductive bumps 3 is embedded in the protection layer 11. However, in other embodiments, the first ends 31 of the conductive bumps 3 may be exposed from the protection layer 11. Then, the protection layer 11 is cured.

Figure 8:
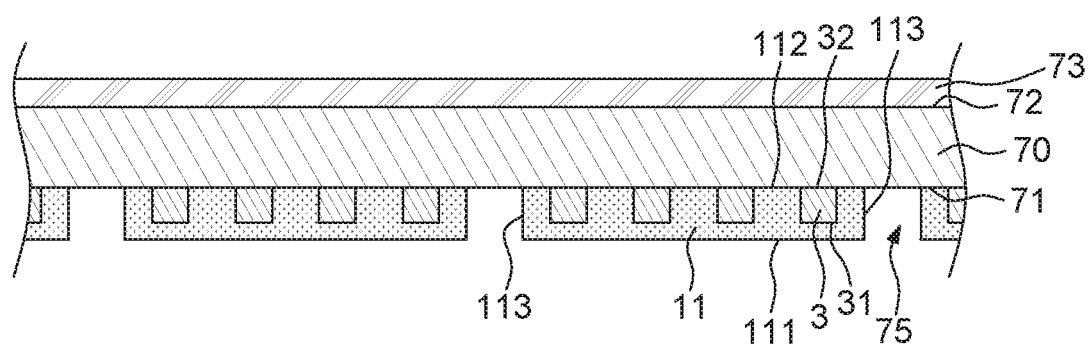
FIG. 8 illustrates one or more stages of a method for manufacturing a semiconductor package according to some embodiments of the present disclosure.

Referring to FIG. 8, the protection layer 11 is singulated. For example, a plurality of grooves 75 are formed on and extend through the protection layer 11 by, for example, a laser grooving technique. The protection layer 11 is divided by the grooves 75 into a plurality of separate protection layers 11. The protection layer 11 covers the conductive bumps 3, such as surrounds and contacts each of the conductive bumps 3. The protection layer 11 has a first surface 111, a second surface 112 opposite to the first surface 111, and a lateral surface 113 extends between the first surface 111 and the second surface 112. The second surface 112 is disposed on and contacts the first surface 71 of the wafer 7. In some embodiments, the laser grooving technique may also remove portions of some metal layers of the wafer 7 corresponding to the grooves 75.

Figure 9:
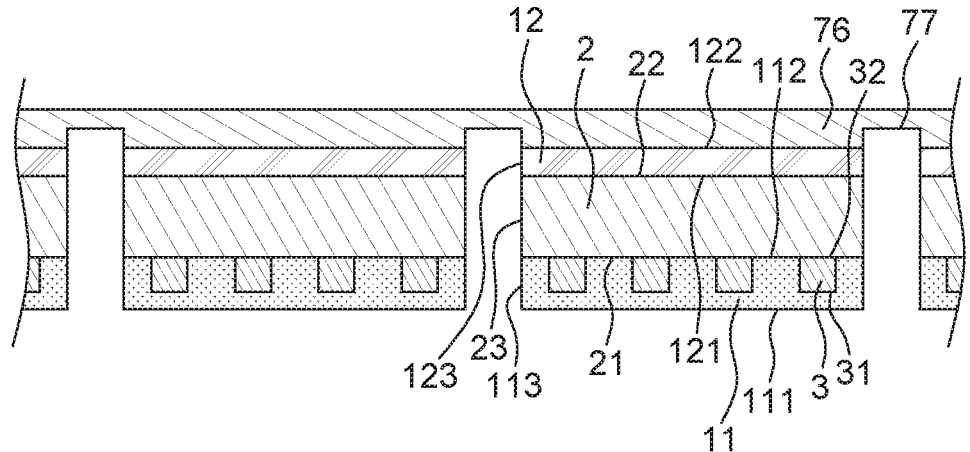
FIG. 9 illustrates one or more stages of a method for manufacturing a semiconductor package according to some embodiments of the present disclosure.

Referring to FIG. 9, the wafer 70 and the DAF 73 are disposed on a dicing tape 76. The dicing tape 76 may be of a pressure sensitive type or a UV releasing type. Then, the semiconductor element (e.g., the wafer 70) is singulated. For example, the wafer 70 is sawed along the grooves 75 into a plurality of semiconductor dice 2. The first surface 71 and the second surface 72 of the wafer 70 respectively forms an active surface 21 and a backside surface 22 of each semiconductor die 2. The active surface 21 is opposite to the backside surface 22. Each of the semiconductor die 2 further has a lateral surface 23 exposed after the singulation process. The lateral surface 23 extends between the active surface 21 and the backside surface 22. The lateral surface 23 of the semiconductor die 2 may be coplanar with the lateral surface 113 of the protection layer 11. In some embodiments, the sawing process may further saw through the DAF 73, and forms a trench 77 on the dicing tape 76. Hence, the DAF 73 is divided into a plurality of separate first adhesive layers 12 on the backside surface 22 of the semiconductor dice 2. The first adhesive layers 12 has a first surface 121, a second surface 122 opposite to the first surface 121, and a lateral surface 123 extending between the first surface 121 and the second surface 122. The first surface 121 is disposed on and contacts the backside surface 22 of the semiconductor die 2. The lateral surface 123 of the first adhesive layer 12 is coplanar with the lateral surface 23 of the semiconductor die 2 and/or the lateral surface 113 of the protection layer 11.

Figure 10:
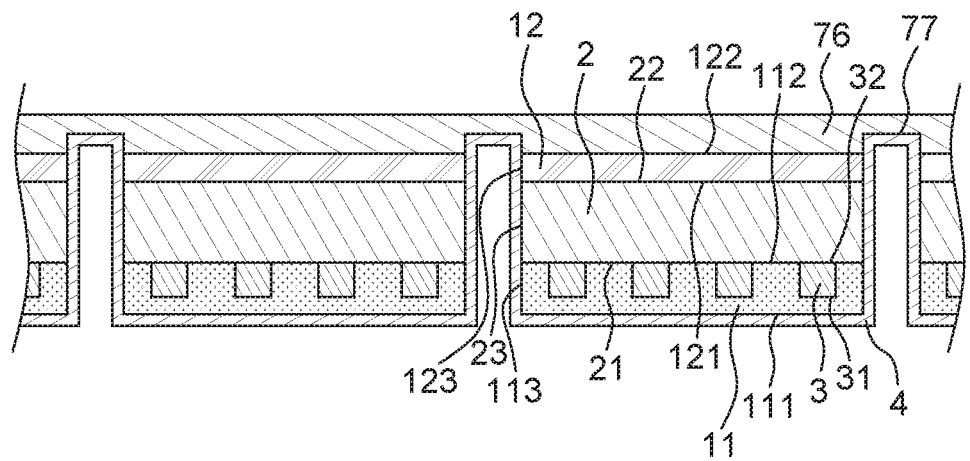
FIG. 10 illustrates one or more stages of a method for manufacturing a semiconductor package according to some embodiments of the present disclosure.

Referring to FIG. 10, a shielding layer 4 is formed on the lateral surface 113 of the protection layer 11. In some embodiments, the shielding layer 4 is further formed on the lateral surface 23 of each of the semiconductor dice 2. The shielding layer 4 covers the semiconductor die 2 and the protection layer 11, and may contact the semiconductor die 2 and the protection layer 11. The shielding layer 4 may be made of a conductive material, such as copper, stainless steel or titanium, and may be formed by sputtering. In some embodiments, the shielding layer 4 may further cover and contact the lateral surface 123 of the first adhesive layer 12, and may extend into the trench 77 of the dicing tape 76. As shown in FIG. 10, the trench defined by the lateral surface 113 of the protection layer 11, the lateral surface 23 of the semiconductor dice 2 and the lateral surface 123 of the first adhesive layer 12 may have an aspect ratio, defined as the ratio of the depth to width, of less than 8; thus, the yield rate of the sputtering of the shielding layer 4 may be relatively high, e.g., higher than 50%, 60% or 70%. After formation of the shielding layer 4, each of the semiconductor dice 2 is picked up from the dicing tape 76, forming a semiconductor unit 78 as shown in FIG. 11.

Figure 12:
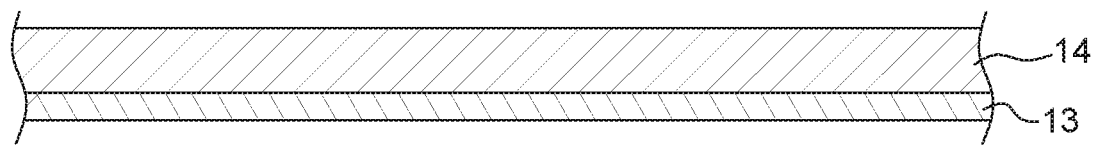
FIG. 12 illustrates one or more stages of a method for manufacturing a semiconductor package according to some embodiments of the present disclosure.

Referring to FIG. 12, a supporting layer 14 is provided with a metal layer 13 disposed thereon. The supporting layer 14 may be a carrier, and may be made of silicon, metal or glass. The metal layer 13 may be made of a conductive metal, such as copper. For example, the metal layer 13 may be a copper film or copper foil disposed on the carrier.

Figure 11:
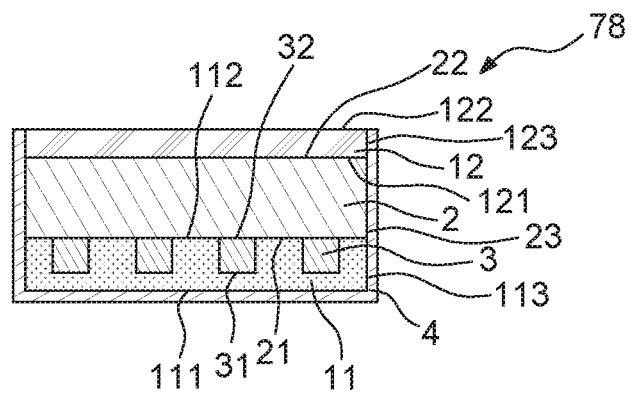
FIG. 11 illustrates one or more stages of a method for manufacturing a semiconductor package according to some embodiments of the present disclosure.
Figure 13:
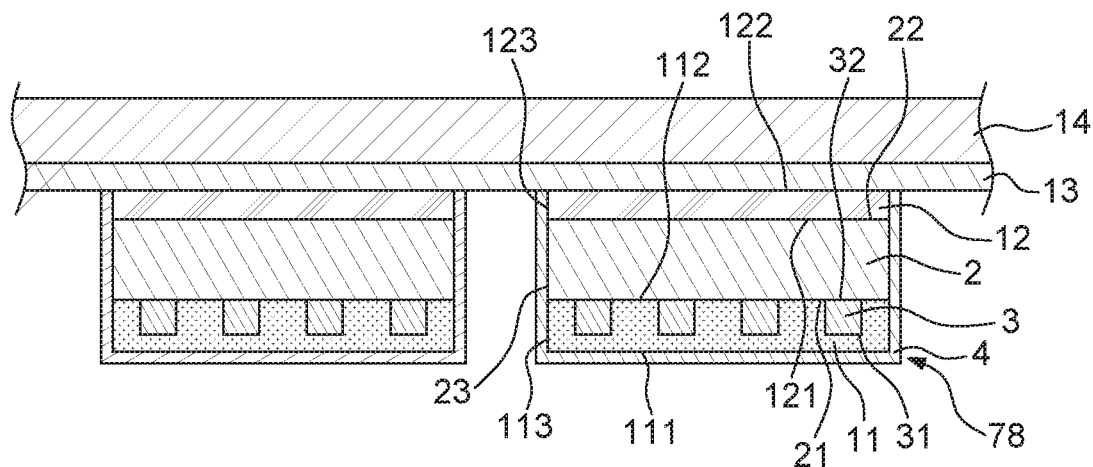
FIG. 13 illustrates one or more stages of a method for manufacturing a semiconductor package according to some embodiments of the present disclosure.
Figure 14:
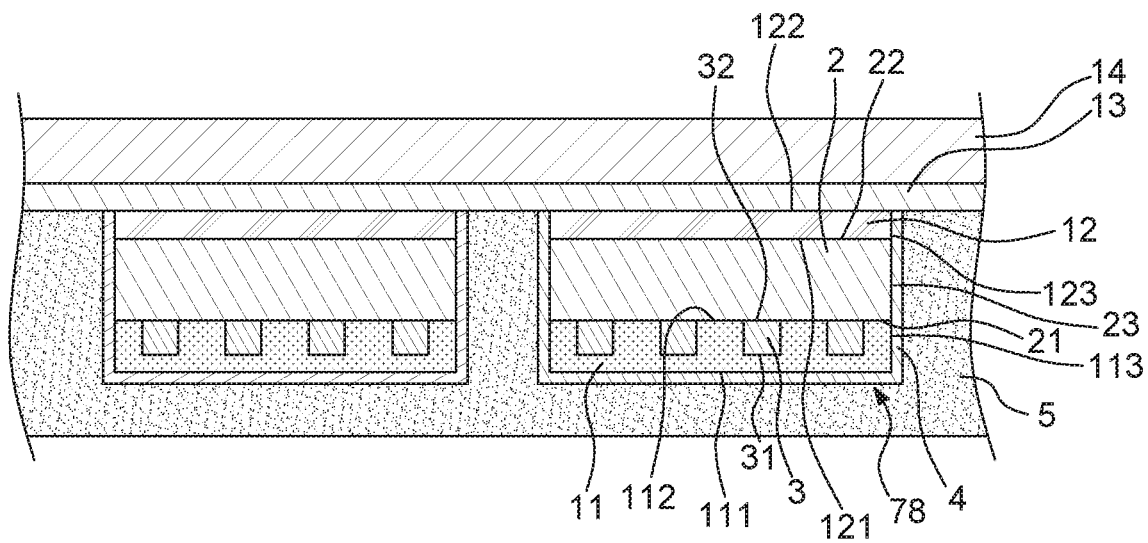
FIG. 14 illustrates one or more stages of a method for manufacturing a semiconductor package according to some embodiments of the present disclosure.

Referring to FIG. 13, the semiconductor unit 78 shown in FIG. 11, including the semiconductor die 2, the conductive bumps 3, the protection layer 11, the first adhesive layer 12 and the shielding layer 4, is disposed on the metal layer 13. FIG. 14 shows two similar semiconductor units 78. However, more or less semiconductor units 78 may be disposed on the metal layer 13, and they may be the same as or different from each other. The backside surface 22 of the semiconductor die 2 is attached to the metal layer 13 through the first adhesive layer 12.

Referring to FIG. 14, an encapsulant 5 is formed or disposed on the metal layer 13 to cover the semiconductor unit 78, including the semiconductor element (e.g., the semiconductor die 2), the conductive bumps 3, the protection layer 11, the first adhesive layer 12 and the shielding layer 4. The encapsulant 5 may be formed by a molding process. A material of the encapsulant 5 may be a molding compound with or without fillers.

Figure 15:
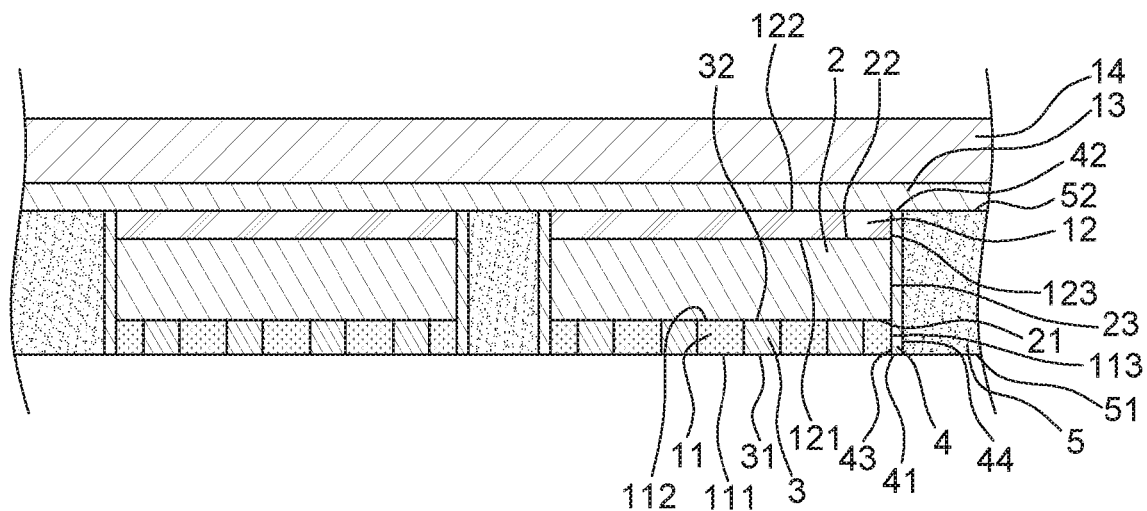
FIG. 15 illustrates one or more stages of a method for manufacturing a semiconductor package according to some embodiments of the present disclosure.

Referring to FIG. 15, a grinding process is conducted to remove a portion of the encapsulant 5, a portion of the shielding layer 4 and a portion of the protection layer 11. In some embodiments, the grinding process may further remove a portion of at least one of the conductive bumps 3. As such, the first end 31 of each of the conductive bumps 3 may be exposed from the protection layer 11, and a portion of the shielding layer 4 may also be exposed to form a first end 41 of the shielding layer 4. The first end 41 of the shielding layer 4 is thus coplanar with the first surface 111 of the protection layer 11 and/or the first end 31 of at least one of the conductive bumps 3. The shielding layer 4 further has a second end 42, an inner surface 43 and an outer surface 44. The second end 42 is opposite to the first end 41. The inner surface 43 and the outer surface 44 extend between the first end 41 and the second end 42. The outer surface 44 is opposite to the inner surface 43. For example, the inner surface 43 of shielding layer 4 contacts the lateral surface 23 of the semiconductor die 2, the lateral surface 113 of the protection layer 11 and/or the lateral surface 123 of the first adhesive layer 12. The second end 42 of the shielding layer 4 is coplanar with the second surface 122 of the first adhesive layer 12. The shielding layer 4 provides electromagnetic shielding function to the lateral surface 23 of the semiconductor die 2. The encapsulant 5 has a first surface 51 and a second surface 52 opposite to the first surface 51. The first surface 51 of the encapsulant 5 is coplanar with the first end 31 of at least one of the conductive bumps 3, the first surface 111 of the protection layer 11, and/or the first end 41 of the shielding layer 4. The second surface 52 of the encapsulant 5 is coplanar with the second surface 122 of the first adhesive layer 12 and/or the second end 42 of the shielding layer 4.

Figure 16:
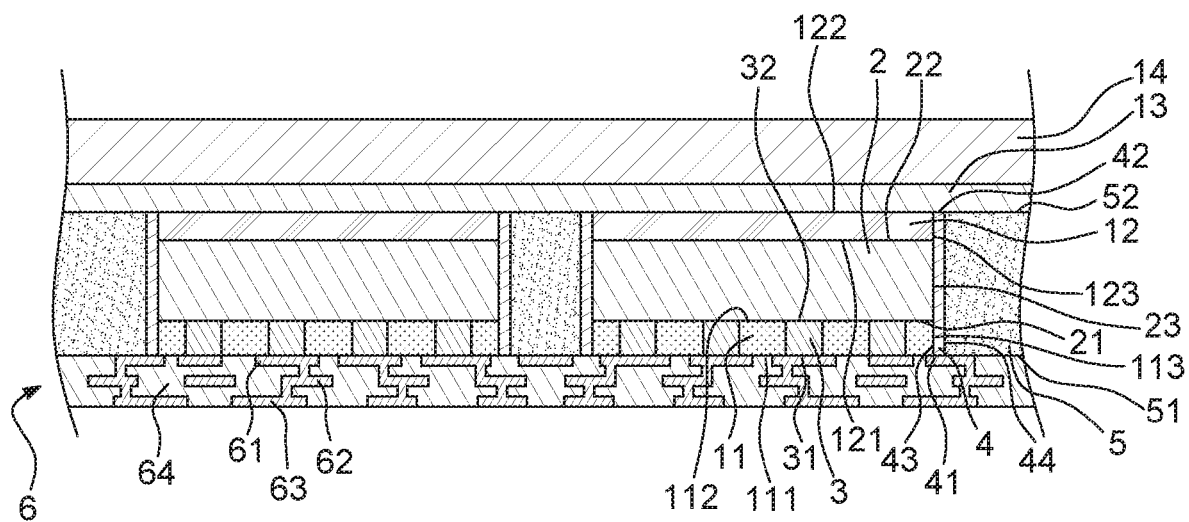
FIG. 16 illustrates one or more stages of a method for manufacturing a semiconductor package according to some embodiments of the present disclosure.

Referring to FIG. 16, a redistribution layer 6 is formed or disposed on the first surface 51 of the encapsulant 5. The redistribution layer 6 may include at least one conductive layer containing traces and pads, and may further include at least one via for connection therebetween. A line width/line space (L/S) of the redistribution layer 6 may be about 2 µm/2 µm. For example, as shown in FIG. 16, the redistribution layer 6 including three conductive layers 61, 62 and 63, which are electrically connected with each other through a plurality of vias. The redistribution layer 6 may further include an insulating structure 64 disposed between these conductive layers 61, 62 and 63. The redistribution layer 6 is electrically connected to the semiconductor die 2 through the conductive bumps 3. For example, at least one of the conductive bumps 3 contacts the topmost conductive layer 61 of the redistribution layer 6. The redistribution layer 6 is also electrically connected to the shielding layer 4. As shown in FIG. 16, the first end 41 of the shielding layer 4 contacts the topmost conductive layer 61 of the redistribution layer 6.

Figure 17:
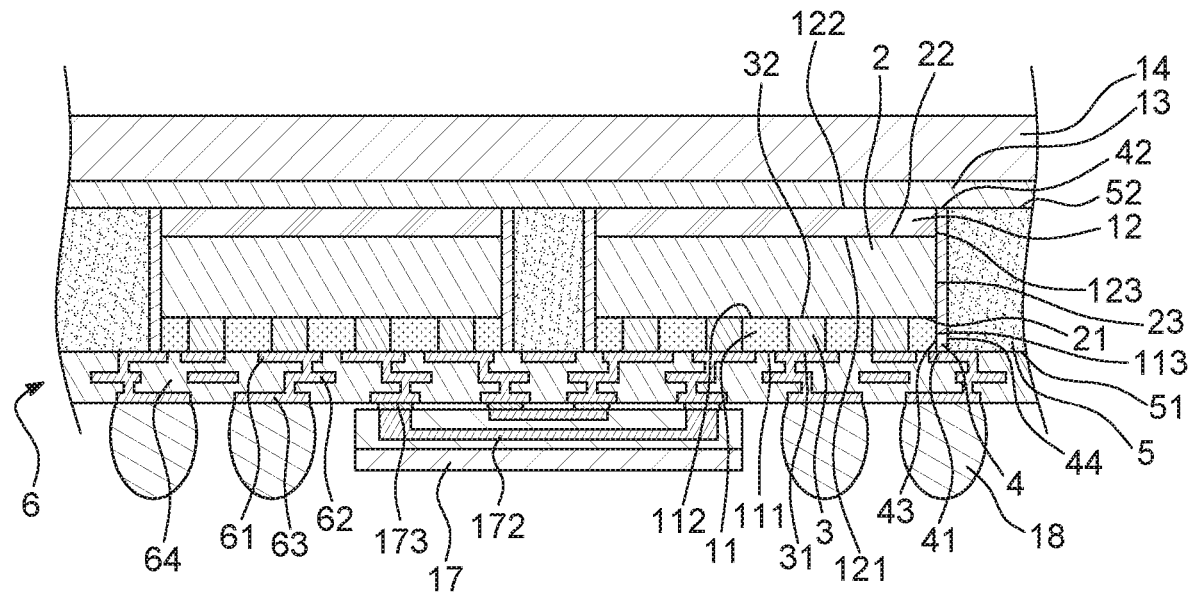
FIG. 17 illustrates one or more stages of a method for manufacturing a semiconductor package according to some embodiments of the present disclosure.

Referring to FIG. 17, an electrical component 17 and a plurality of connecting elements 18 are disposed on and electrically connected to the redistribution layer 6. The electrical component 17 may be a passive component or another semiconductor die, or an interposer. For example, as shown in FIG. 17, the electrical component 17 is a bridge connector, which includes an inner circuit 172 for electrically connecting the two semiconductor dice 2. The electrical component 17 may further include a plurality of solders 173 for electrical connection with the bottom most conductive layer 63 of the redistribution layer 6. The connecting elements 18 may be electrically connected to the bottommost conductive layer 63 of the redistribution layer 6 for external connection purpose.

Figure 18:
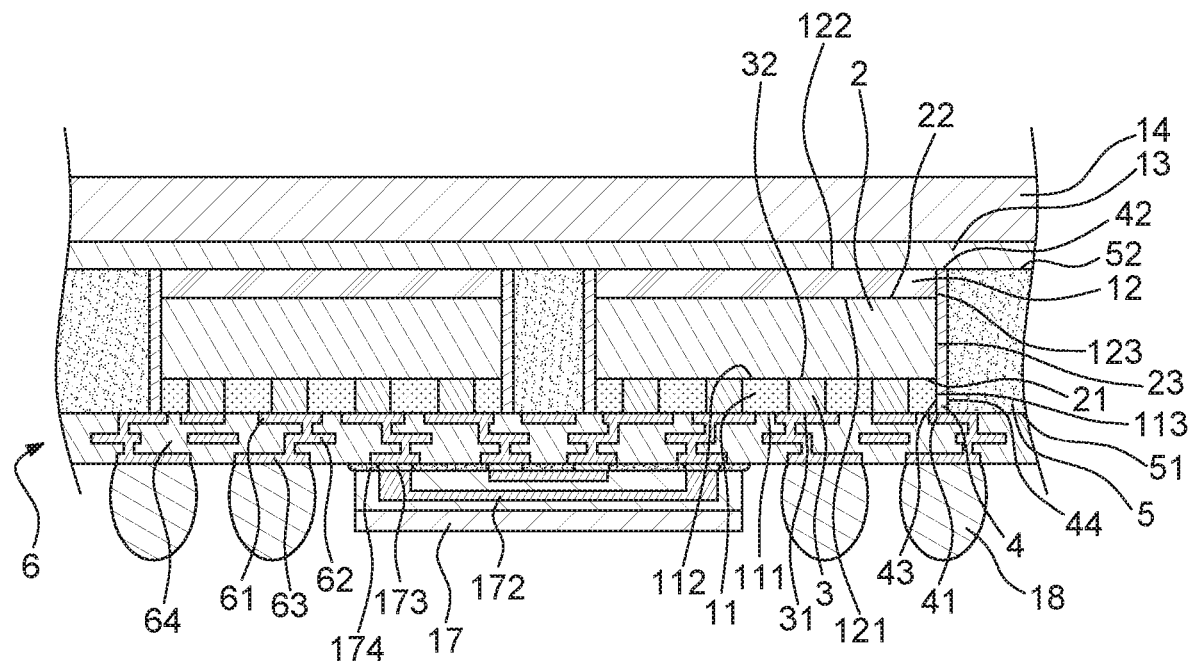
FIG. 18 illustrates one or more stages of a method for manufacturing a semiconductor package according to some embodiments of the present disclosure.

Referring to FIG. 18, an underfill 174 is disposed and filled between the electrical component 17 and the redistribution layer 6, and covers the solders 173.

Figure 19:
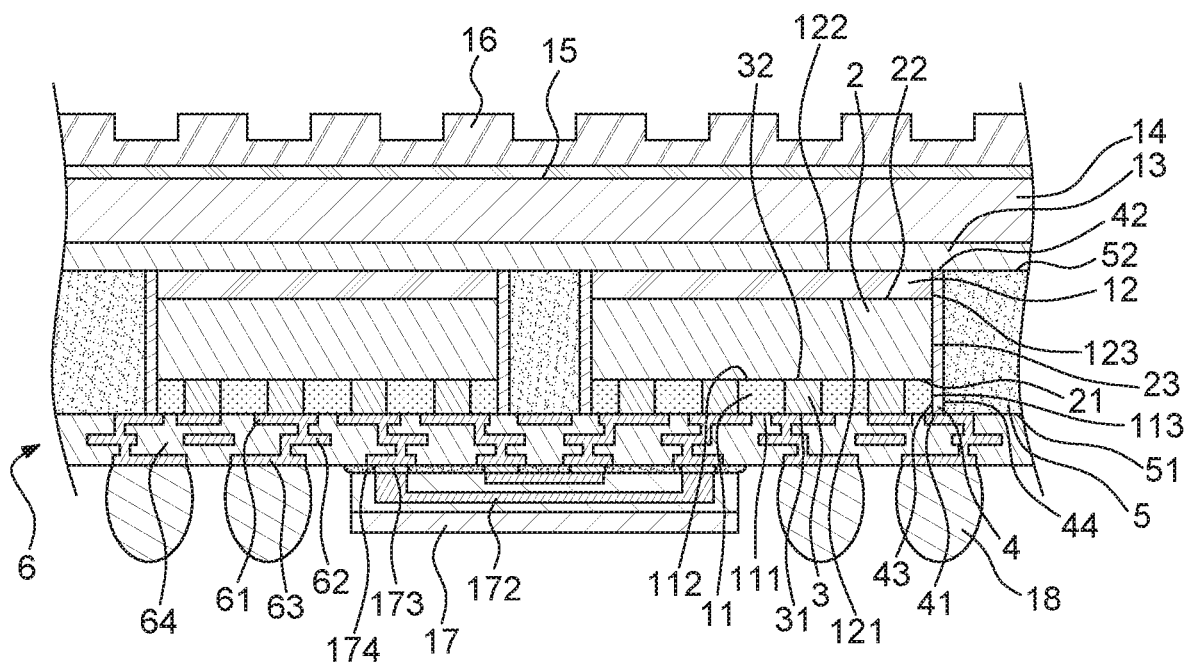
FIG. 19 illustrates one or more stages of a method for manufacturing a semiconductor package according to some embodiments of the present disclosure.

Referring to FIG. 19, a heat sink 16 is attached to the supporting layer 14 through a second adhesive layer 15 for dissipation purpose. That is, the heat sink 16 is disposed adjacent to the second surface 52 of the encapsulant 5. A material of the second adhesive layer 15 may be any adhesive which is able to attach the heat sink 16 to the supporting layer 14, and may be the same as or different from the material of the first adhesive layer 12. Then, a sawing process is conducted to cut through the heat sink 16, the second adhesive layer 15, the supporting layer 14, the metal layer 13, the encapsulant 5 and the redistribution layer 6, thus forming the semiconductor package 1 as shown in FIG. 1.

In the aforementioned method, the shielding layer 4 is formed before formation of the encapsulant 5. Hence, the shielding layer 4 can cover and contact the semiconductor die 2. Since the surface area of the semiconductor die 2 is much less than the surface area of the encapsulant 5, the production rate of the semiconductor package 1 is greater than that of the aforementioned package level shielding process. Besides, the presence of the supporting layer 14 can resist warpage during formation of the encapsulant 5 and/or the redistribution layer 6.

FIG. 20 through FIG. 34 illustrate a method for manufacturing a semiconductor package according to some embodiments of the present disclosure. In some embodiments, the method is for manufacturing a semiconductor package such as the semiconductor package 1a shown in FIG. 2.

Figure 20:
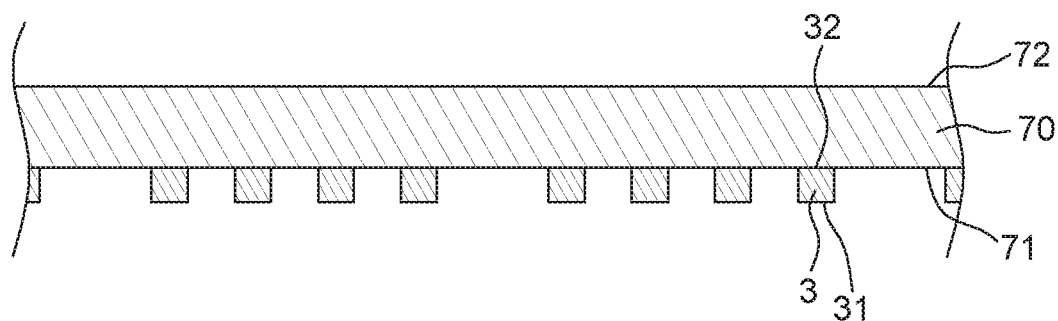
FIG. 20 illustrates one or more stages of a method for manufacturing a semiconductor package according to some embodiments of the present disclosure.

Referring to FIG. 20, a semiconductor element, such as a wafer 70 is provided. The wafer 70 has a first surface 71 and a second surface 72 opposite to the first surface 71. The wafer 70 includes a plurality of conductive bumps 3 disposed on the first surface 71. The conductive bumps 3 may be pillars or posts made of conductive material, such as copper. Each of the conductive bumps 3 includes a first end 31 and a second end 32 opposite to the first end 31. The second end 32 is disposed on and contacts the first surface 71 of the wafer 70. In a later step, the wafer 70 may be separated into a plurality of semiconductor dice.

Figure 21:
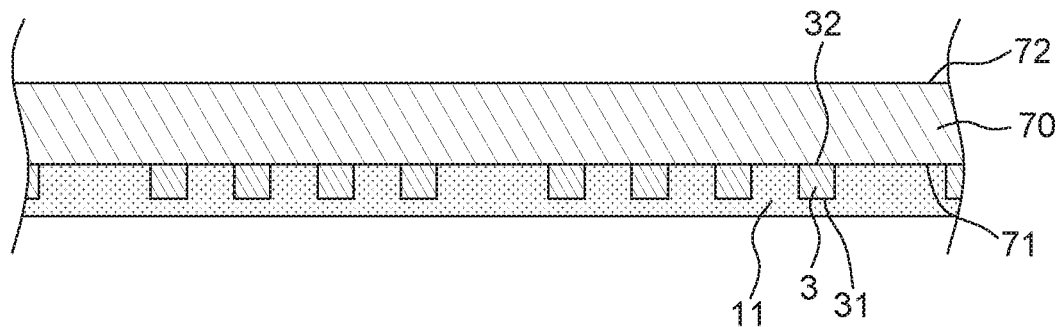
FIG. 21 illustrates one or more stages of a method for manufacturing a semiconductor package according to some embodiments of the present disclosure.

Referring to FIG. 21, a protection layer 11 is formed on the first surface 71 of the wafer 70 to cover the conductive bumps 3. The protection layer 11 may be made of cured PID materials, such as an epoxy or a PI including photoinitiators, or other resin materials. As shown in FIG. 21, the first end 31 of each of the conductive bumps 3 is embedded in the protection layer 11. However, in other embodiments, the first ends 31 of the conductive bumps 3 may be exposed from the protection layer 11. Then, the protection layer 11 is cured.

Figure 22:
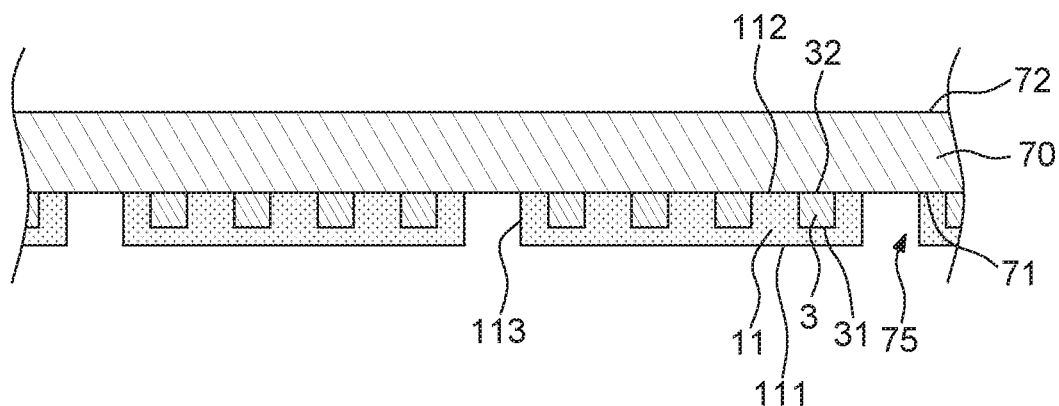
FIG. 22 illustrates one or more stages of a method for manufacturing a semiconductor package according to some embodiments of the present disclosure.

Referring to FIG. 22, the protection layer 11 is singulated. For example, a plurality of grooves 75 are formed on and extend through the protection layer 11 by, for example, a laser grooving technique. The protection layer 11 is divided by the grooves 75 into a plurality of separate protection layers 11. The protection layer 11 covers the conductive bumps 3, such as surrounds and contacts each of the conductive bumps 3. The protection layer 11 has a first surface 111, a second surface 112 opposite to the first surface 111, and a lateral surface 113 extends between the first surface 111 and the second surface 112. The second surface 112 is disposed on and contacts the first surface 71 of the wafer 7.

Figure 23:
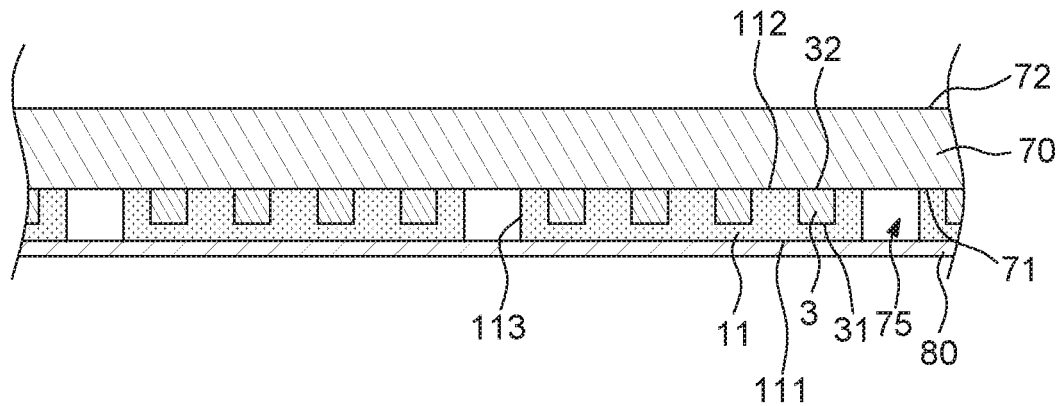
FIG. 23 illustrates one or more stages of a method for manufacturing a semiconductor package according to some embodiments of the present disclosure.

Referring to FIG. 23, the wafer 70 and the protection layer 11 are disposed on a dicing tape 80, with the first surface 111 of the protection layer 11 contacting and attached to the dicing tape 80. It is noted that the dicing tape 80 is fixed in a frame.

Figure 24:
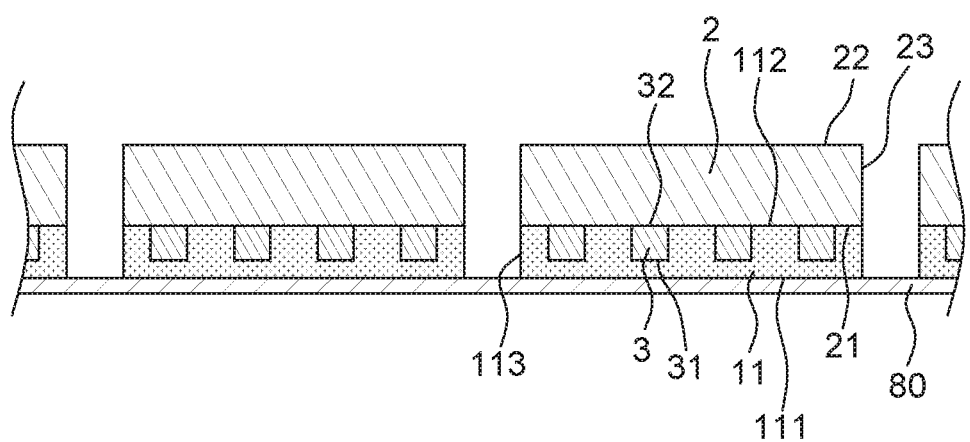
FIG. 24 illustrates one or more stages of a method for manufacturing a semiconductor package according to some embodiments of the present disclosure.

Referring to FIG. 24, the semiconductor element (e.g., the wafer 70) is singulated. For example, the wafer 70 is sawed along a position corresponding to the grooves 75 into a plurality of semiconductor dice 2. The first surface 71 and the second surface 72 of the wafer 70 respectively form an active surface 21 and a backside surface 22 of each semiconductor die 2. The active surface 21 is opposite to the backside surface 22. Each of the semiconductor die 2 further has a lateral surface 23 exposed after the singulation process. The lateral surface 23 extends between the active surface 21 and the backside surface 22. The lateral surface 23 of the semiconductor die 2 may be coplanar with the lateral surface 113 of the protection layer 11.

Figure 25:
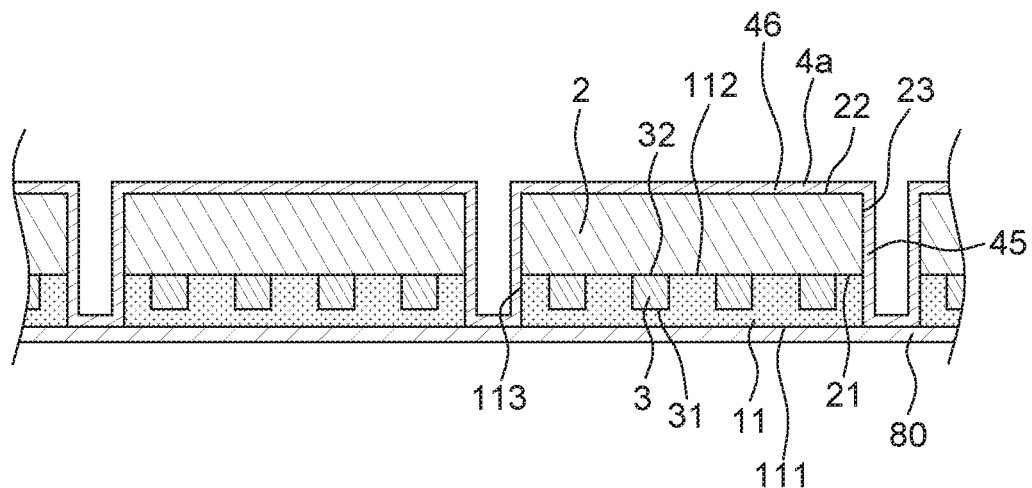
FIG. 25 illustrates one or more stages of a method for manufacturing a semiconductor package according to some embodiments of the present disclosure.

Referring to FIG. 25, a shielding layer 4a is formed on the lateral surface 113 of the protection layer 11. In some embodiments, the shielding layer 4a is further formed on the lateral surface 23 and the backside surface 22 of each of the semiconductor dice 2. The shielding layer 4a covers the semiconductor die 2. The shielding layer 4a may be made of a conductive material, such as copper, stainless steel or titanium, and may be formed by sputtering. The shielding layer 4a includes a side wall 45 and a top wall 46. The side wall 45 is disposed on and contacts the lateral surface 23 of the semiconductor die 2 and/or the lateral surface 113 of the protection layer 11. The top wall 46 is disposed on and contacts the backside surface 22 of the semiconductor die 2. Then, each of the semiconductor dice 2 is picked up from the dicing tape 80, forming a semiconductor unit 78a as shown in FIG. 26.

Figure 27:
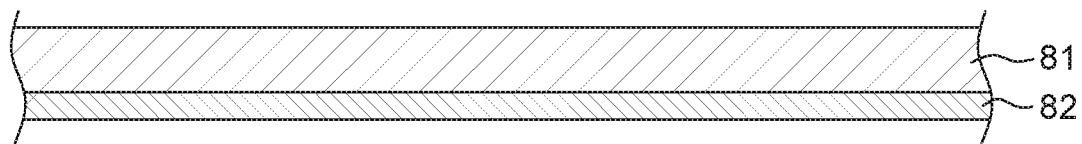
FIG. 27 illustrates one or more stages of a method for manufacturing a semiconductor package according to some embodiments of the present disclosure.

Referring to FIG. 27, a carrier 81 is provided with a thermal release tape 82 disposed thereon. The carrier 81 may be made of silicon, metal or glass, and may be the same as or different from the supporting layer 14 described above.

Figure 26:
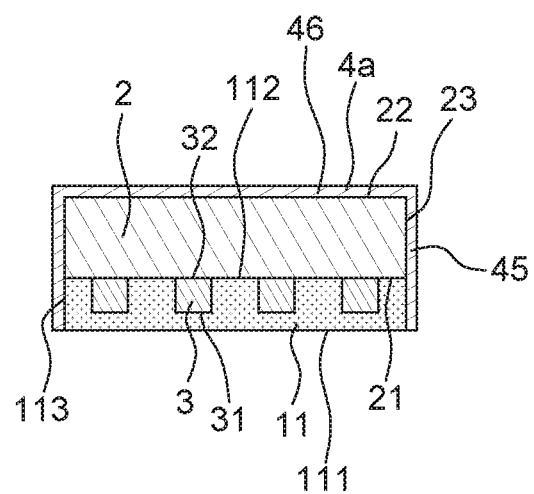
FIG. 26 illustrates one or more stages of a method for manufacturing a semiconductor package according to some embodiments of the present disclosure.
Figure 28:
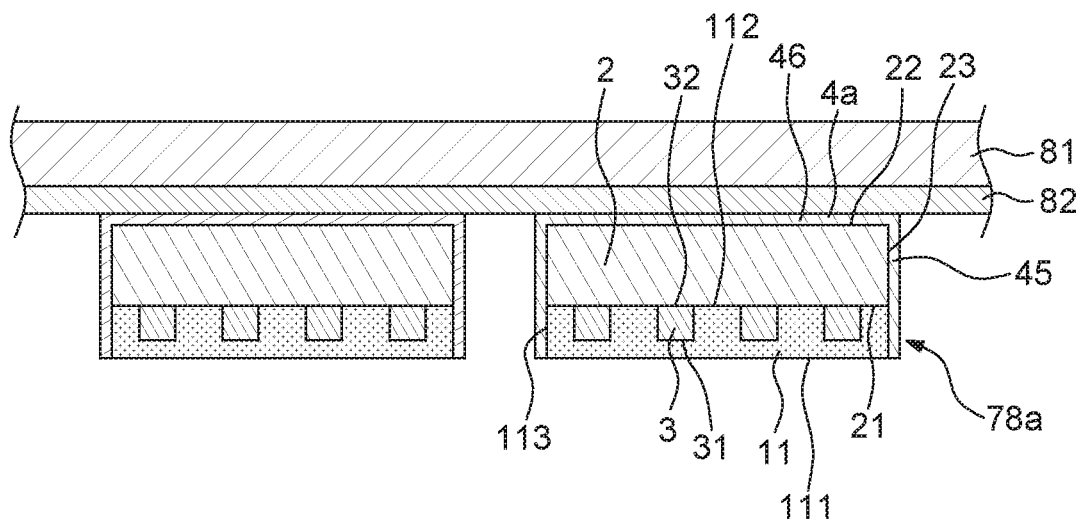
FIG. 28 illustrates one or more stages of a method for manufacturing a semiconductor package according to some embodiments of the present disclosure.

Referring to FIG. 28, the semiconductor unit 78a shown in FIG. 26, including the semiconductor die 2, the conductive bumps 3, the protection layer 11 and the shielding layer 4a, is disposed on the thermal release tape 82. FIG. 28 shows two similar semiconductor units 78a. However, more or less semiconductor units 78a may be disposed on the thermal release tape 82, and they may be the same as or different from each other. The top wall 46 of the shielding layer 4a is attached to the thermal release tape 82.

Figure 29:
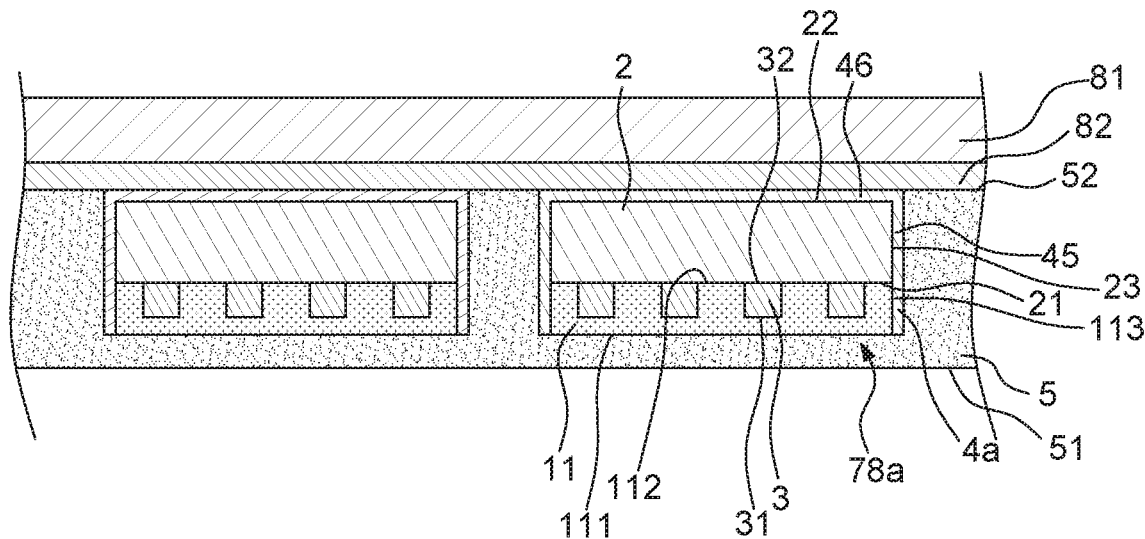
FIG. 29 illustrates one or more stages of a method for manufacturing a semiconductor package according to some embodiments of the present disclosure.

Referring to FIG. 29, an encapsulant 5 is formed or disposed on the thermal release tape 82 to cover the semiconductor unit 78a, including the semiconductor element (e.g., the semiconductor die 2), the conductive bumps 3, the protection layer 11 and the shielding layer 4a. The encapsulant 5 may be formed by a molding process. A material of the encapsulant 5 may be a molding compound with or without fillers.

Figure 30:
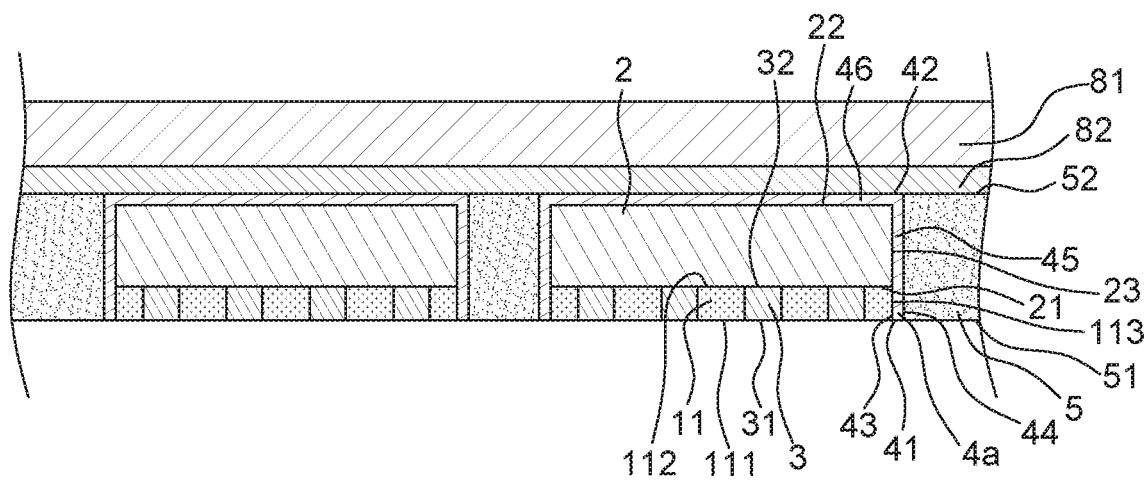
FIG. 30 illustrates one or more stages of a method for manufacturing a semiconductor package according to some embodiments of the present disclosure.

Referring to FIG. 30, a grinding process is conducted to remove a portion of the encapsulant 5, a portion of the shielding layer 4a and a portion of the protection layer 11. In some embodiments, the grinding process may further remove a portion of at least one of the conductive bumps 3. As such, the first end 31 of each of the conductive bumps 3 may be exposed from the protection layer 11, and a first end 41 of the side wall 45 of the shielding layer 4a is formed coplanar with the first end 31 of the conductive bumps 3. The first end 41 of the side wall 45 of the shielding layer 4a is further coplanar with the first surface 111 of the protection layer 11. The side wall 45 of the shielding layer 4a further has a second end 42, an inner surface 43 and an outer surface 44. The second end 42 is opposite to the first end 41. The top wall 46 is connected to the second end 42 of the side wall 45. The inner surface 43 and the outer surface 44 extend between the first end 41 and the second end 42. The outer surface 44 is opposite to the inner surface 43. For example, the inner surface 43 of the sidewall 45 of the shielding layer 4a contacts the lateral surface 23 of the semiconductor die 2 and/or the lateral surface 113 of the protection layer 11. The shielding layer 4a provides electromagnetic shielding function to the backside surface 22 and the lateral surface 23 of the semiconductor die 2. The encapsulant 5 has a first surface 51 and a second surface 52 opposite to the first surface 51. The first surface 51 of the encapsulant 5 is coplanar with the first end 31 of at least one of the conductive bumps 3, the first surface 111 of the protection layer 11, and/or the first end 41 of the side wall 45 of the shielding layer 4a. The second surface 52 of the encapsulant 5 is coplanar with the second end 42 of the side wall 45 of the shielding layer 4a and a top surface of the top wall 46 of the shielding layer 4a.

Figure 31:
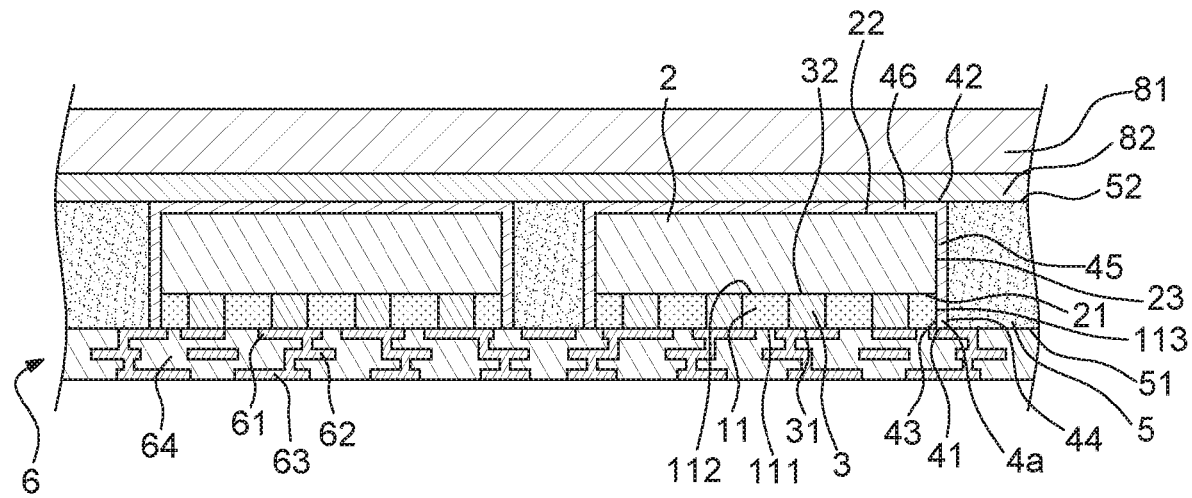
FIG. 31 illustrates one or more stages of a method for manufacturing a semiconductor package according to some embodiments of the present disclosure.

Referring to FIG. 31, a redistribution layer 6 is formed or disposed on the first surface 51 of the encapsulant 5. The redistribution layer 6 may include at least one conductive layer containing traces and pads, and may further include at least one via for connection therebetween. A line width/line space (L/S) of the redistribution layer 6 may be about 2 µm/2 µm. For example, as shown in FIG. 31, the redistribution layer 6 including three conductive layers 61, 62 and 63, which are electrically connected with each other through a plurality of vias. The redistribution layer 6 may further include an insulating structure 64 disposed between these conductive layers 61, 62 and 63. The redistribution layer 6 is electrically connected to the semiconductor die 2 through the conductive bumps 3. For example, at least one of the conductive bumps 3 contacts the topmost conductive layer 61 of the redistribution layer 6. The redistribution layer 6 is also electrically connected to the shielding layer 4a. As shown in FIG. 31, the first end 41 of the side wall 45 of the shielding layer 4a contacts the topmost conductive layer 61 of the redistribution layer 6.

Figure 32:
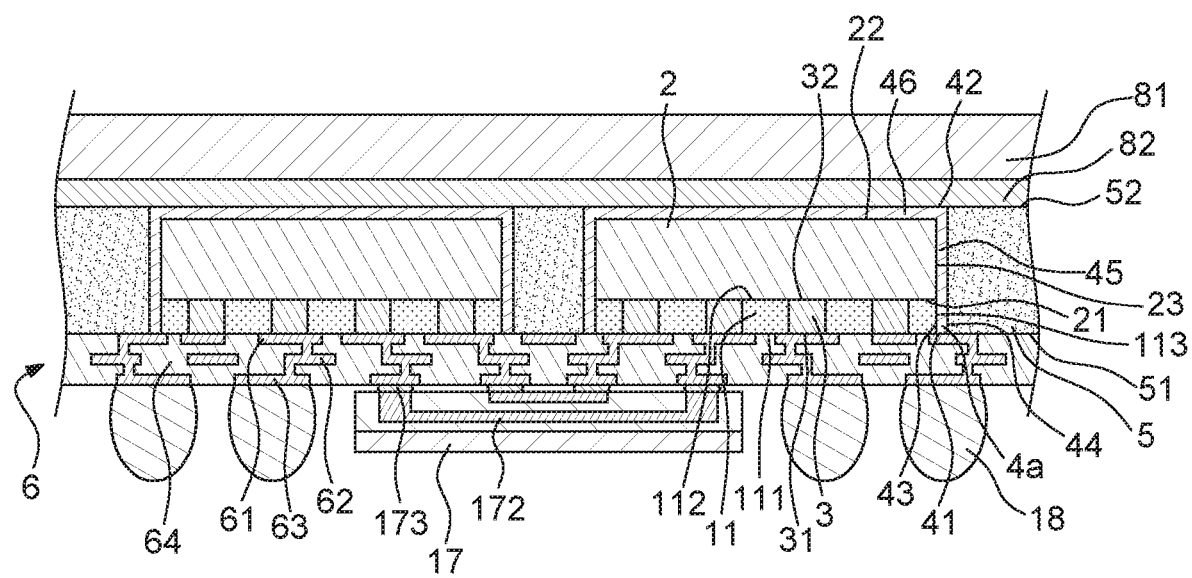
FIG. 32 illustrates one or more stages of a method for manufacturing a semiconductor package according to some embodiments of the present disclosure.

Referring to FIG. 32, an electrical component 17 and a plurality of connecting elements 18 are disposed on and electrically connected to the redistribution layer 6. The electrical component 17 may be a passive component or another semiconductor die, or an interposer. For example, as shown in FIG. 32, the electrical component 17 is a bridge connector, which includes an inner circuit 172 for electrically connecting the two semiconductor dice 2. The electrical component 17 may further include a plurality of solders 173 for electrical connection with the bottom most conductive layer 63 of the redistribution layer 6. The connecting elements 18 may be electrically connected to the bottommost conductive layer 63 of the redistribution layer 6 for external connection purpose.

Figure 33:
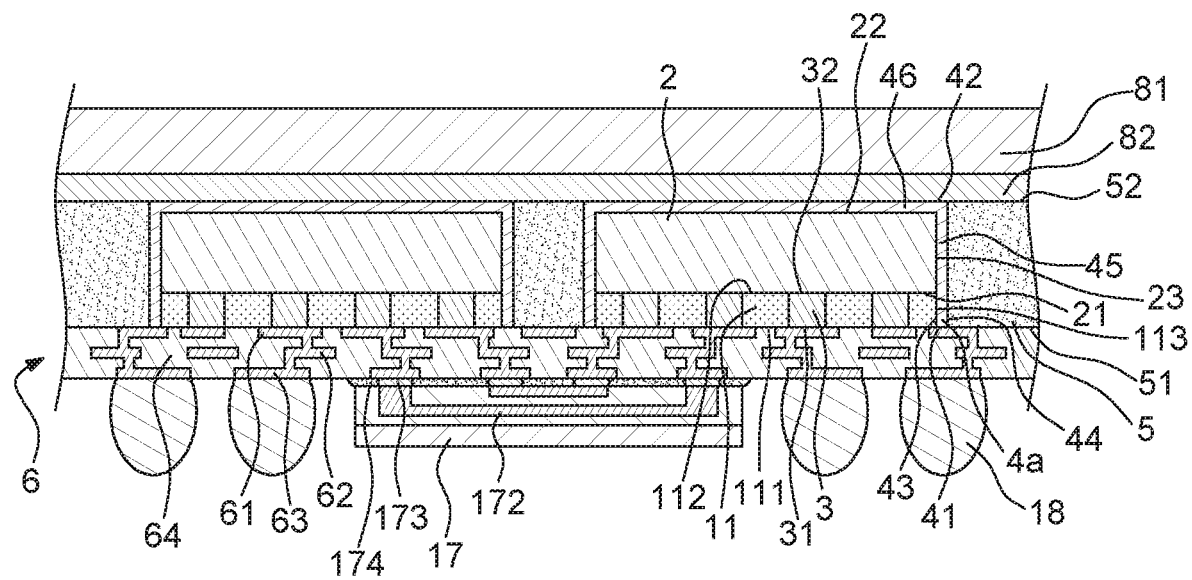
FIG. 33 illustrates one or more stages of a method for manufacturing a semiconductor package according to some embodiments of the present disclosure.

Referring to FIG. 33, an underfill 174 is disposed and filled between the electrical component 17 and the redistribution layer 6, and covers the solders 173.

Figure 34:
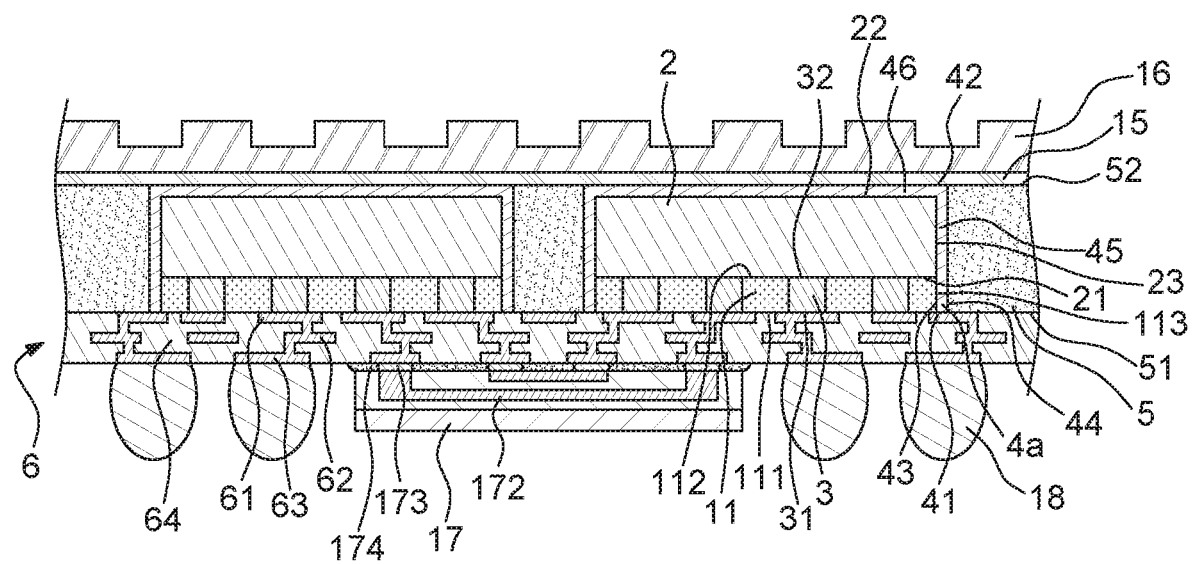
FIG. 34 illustrates one or more stages of a method for manufacturing a semiconductor package according to some embodiments of the present disclosure.

Referring to FIG. 34, the carrier 81 and the thermal release tape 82 are removed by exposing to a heat source or a UV source. Then, a heat sink 16 is attached to the second surface 52 of the encapsulant 5 through a second adhesive layer 15 for dissipation purpose. That is, the heat sink 16 is disposed adjacent to the second surface 52 of the encapsulant 5. A material of the second adhesive layer 15 may be any adhesive which is able to attach the heat sink 16 to the second surface 52 of the encapsulant 5. Then, a sawing process is conducted to cut through the heat sink 16, the second adhesive layer 15, the encapsulant 5 and the redistribution layer 6, thus forming the semiconductor package 1a as shown in FIG. 2.

In the aforementioned method, since the shielding layer 4a covers the backside surface 22 and the lateral surface 23 of the semiconductor die 2, the metal layer 13 can be omitted, and the carrier 81 can be removed. Thus, the semiconductor package 1a shown in FIG. 2 is provided with a total thickness less than that of the semiconductor package 1 shown in FIG. 1.

FIG. 35 through FIG. 50 illustrate a method for manufacturing a semiconductor package according to some embodiments of the present disclosure. In some embodiments, the method is for manufacturing a semiconductor package such as the semiconductor package 1b shown in FIG. 3.

Figure 35:
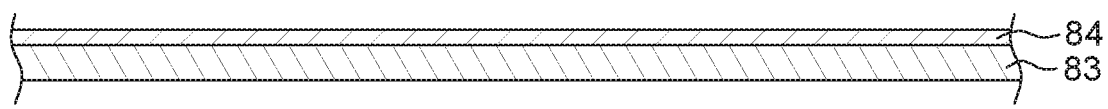
FIG. 35 illustrates one or more stages of a method for manufacturing a semiconductor package according to some embodiments of the present disclosure.

Referring to FIG. 35, a carrier 83 is provided with a releasing film 84 disposed thereon. The carrier 83 and the releasing film 84 may be the same as or different form the carrier 81 and the thermal release tape 82 shown in FIG. 27.

Figure 36:
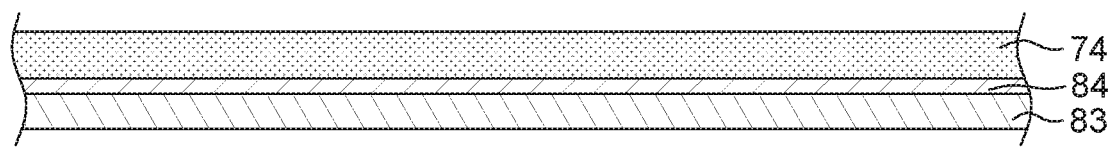
FIG. 36 illustrates one or more stages of a method for manufacturing a semiconductor package according to some embodiments of the present disclosure.
Figure 37:
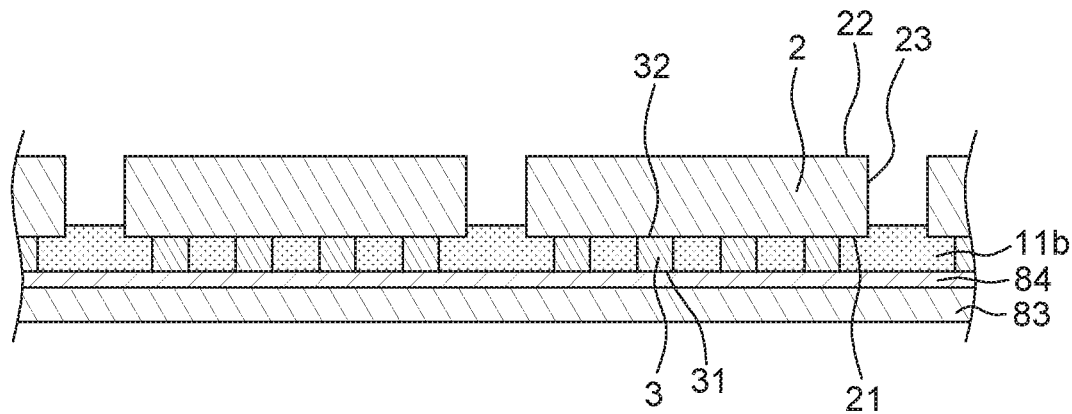
FIG. 37 illustrates one or more stages of a method for manufacturing a semiconductor package according to some embodiments of the present disclosure.

Referring to FIG. 36, a protection material 74 is coated on the releasing film 84. The protection material 74 may be selected from PID materials, such as an epoxy or a PI including photoinitiators, or other resin materials, and is not yet cured. Referring to FIG. 37, a semiconductor element, such as one or a plurality of semiconductor dice 2, is provided. Each of the semiconductor dice 2 has an active surface 21, a backside surface 22 opposite to the active surface 21, and a lateral surface 23 extending between the active surface 21 and the backside surface 22. Each of the semiconductor dice 2 includes a plurality of conductive bumps 3 disposed on the active surface 21. The conductive bumps 3 may be pillars or posts made of conductive material, such as copper. Each of the conductive bumps 3 includes a first end 31 and a second end 32 opposite to the first end 31. The second end 32 is disposed on and contacts the active surface 21 of the semiconductor die 2. These semiconductor dice 2 can be the same as or different from each other. Then, the semiconductor dice 2 are disposed on the protection material 74, with the conductive bumps 3 penetrating into and embedded in the protection material 74. Thus, the protection material 74 forms a protection layer 11b on the active surface 21 of the semiconductor die 2. The protection layer 11b covers and surrounds each of the conductive bumps 3, and may further cover a portion of the semiconductor die 2. For example, as shown in FIG. 37, the protection layer 11b contacts the active surface 21 of the semiconductor die 2 and a portion of the lateral surface 23 of the semiconductor die 2. Then, the protection layer 11b may be cured.

Figure 38:
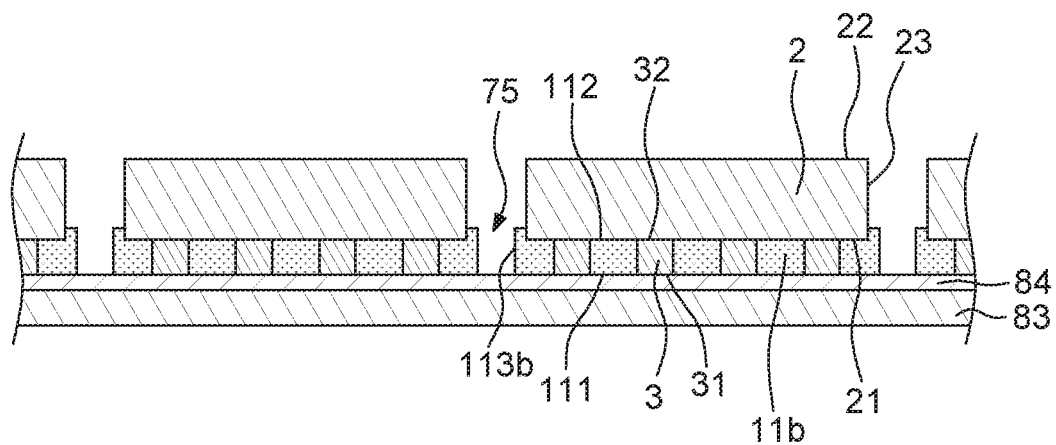
FIG. 38 illustrates one or more stages of a method for manufacturing a semiconductor package according to some embodiments of the present disclosure.

Referring to FIG. 38, the protection layer 11b is singulated. For example, a plurality of grooves 75 are formed on and extends through the protection layer 11 by, for example, laser grooving technique. The grooves 75 are formed between two adjacent semiconductor dice 2. The protection layer 11b is divided by the grooves 75 into a plurality of separate protection layers 11b. The protection layer 11 has a first surface 111, a second surface 112 opposite to the first surface 111, and a lateral surface 113 extends between the first surface 111 and the second surface 112. The second surface 112 is disposed on and contacts the active surface 21 of the semiconductor die 2. The first surface 112 of the protection layer 11 is coplanar with the second end 32 of at least one of the conductive bumps 3. The protection layer 11b further covers a portion of the lateral surface 23 of the semiconductor die 2. The lateral surface 113b of the protection layer 11b is not coplanar with the lateral surface 23 of the semiconductor die 2. A surface area of the first surface 111 of the protection layer 11b is greater than a surface area of the active surface 21 of the semiconductor die 2.

Figure 39:
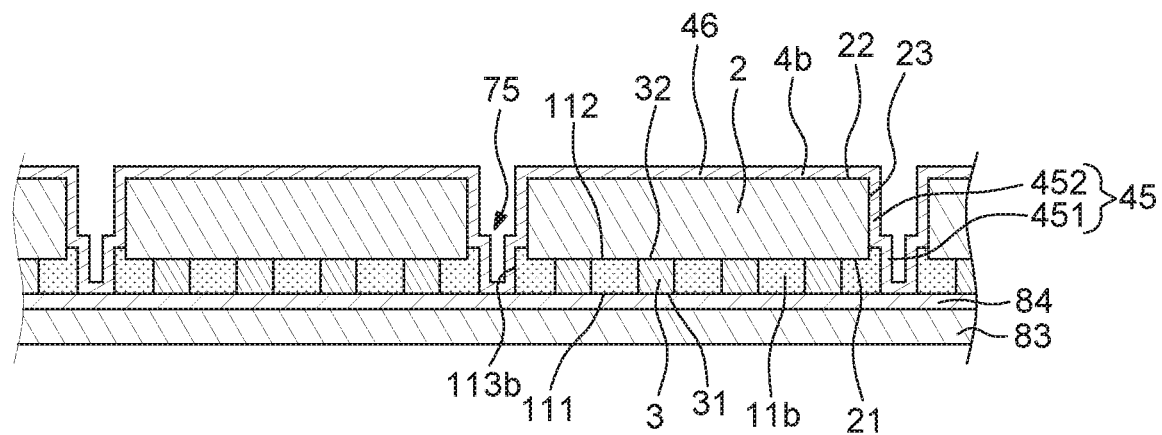
FIG. 39 illustrates one or more stages of a method for manufacturing a semiconductor package according to some embodiments of the present disclosure.

Referring to FIG. 39, a shielding layer 4b is formed on the lateral surface 113 of the protection layer 11. In some embodiments, the shielding layer 4b is further formed on the lateral surface 23 and the backside surface 22 of each of the semiconductor dice 2. The shielding layer 4b covers the semiconductor die 2. The shielding layer 4b may be made of a conductive material, such as copper, stainless steel or titanium, and may be formed by sputtering. The shielding layer 4a includes a side wall 45 and a top wall 46. The side wall 45 includes a first portion 451 and a second portion 452.

The first portion 451 is disposed on and contacts the lateral surface 113 of the protection layer 11. The second portion 452 is disposed on and contacts the lateral surface 23 of the semiconductor die 2. An area defined by the first portion 451 from a bottom view is greater than an area defined by the second portion 452 from a bottom view. The top wall 46 is disposed on and contacts the backside surface 22 of the semiconductor die 2.

Figure 40:
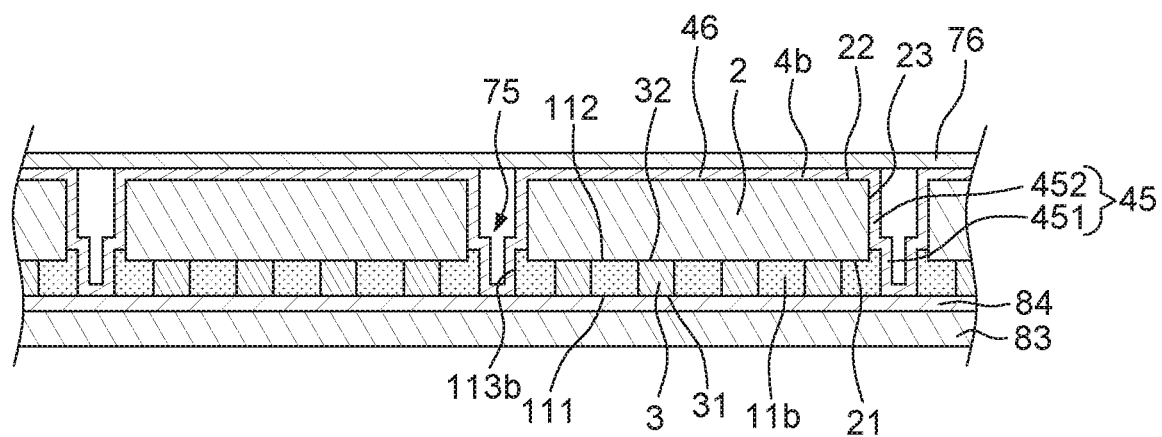
FIG. 40 illustrates one or more stages of a method for manufacturing a semiconductor package according to some embodiments of the present disclosure.

Referring to FIG. 40, a dicing tape 76 is attached to the backside surfaces 22 of the semiconductor dice 2. The dicing tape 76 may be of a pressure sensitive type or a UV releasing type.

Figure 41:
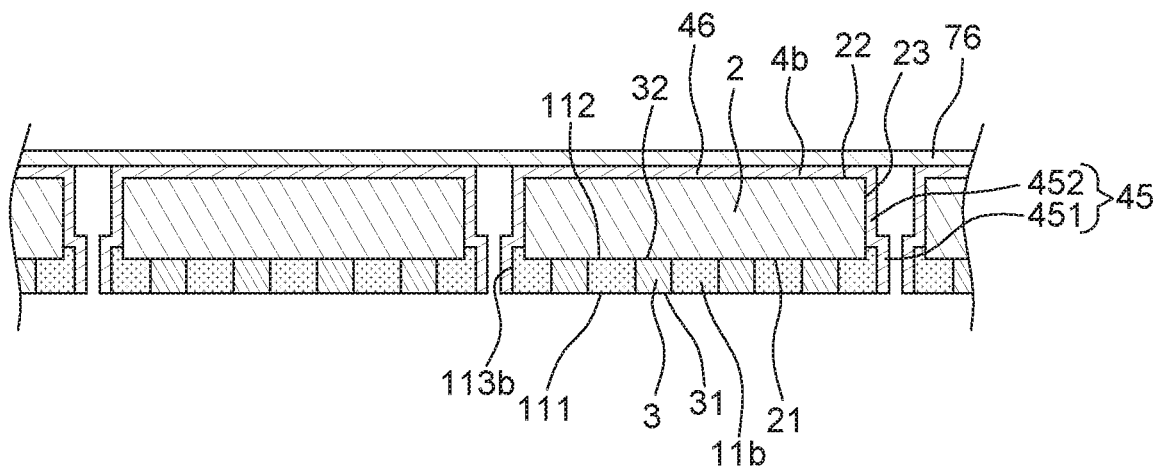
FIG. 41 illustrates one or more stages of a method for manufacturing a semiconductor package according to some embodiments of the present disclosure.
Figure 42:
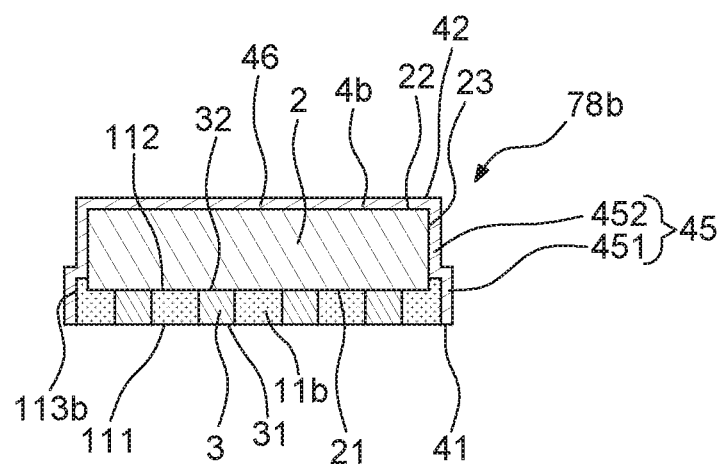
FIG. 42 illustrates one or more stages of a method for manufacturing a semiconductor package according to some embodiments of the present disclosure.

Referring to FIG. 41, the carrier 83 and the releasing film 84 are removed. Then, each of the semiconductor dice 2 is picked up from the dicing tape 85, forming a semiconductor unit 78b as shown in FIG. 42. In such semiconductor unit 78b, the side wall 45 of the shielding layer 4b has a first end 41 included in the first portion 451 of the side wall 45 and a second end 42 included in the second portion 452 of the side wall 45. The second end 42 is opposite to the first end 41. The first end 41 is coplanar with the first end 31 of at least one of the conductive bumps 3 and/or the first surface 111 of the protection layer 11b. The top wall 46 is connected to the second end 42 of the side wall 45.

Figure 43:
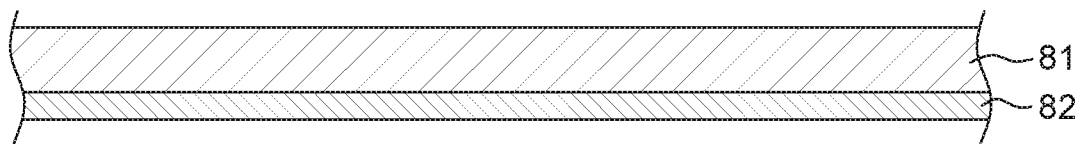
FIG. 43 illustrates one or more stages of a method for manufacturing a semiconductor package according to some embodiments of the present disclosure.

Referring to FIG. 43, a carrier 81 is provided with a thermal release tape 82 disposed thereon. The carrier 81 may be made of silicon, metal or glass, and may be the same as or different from the supporting layer 14 described above.

Figure 44:
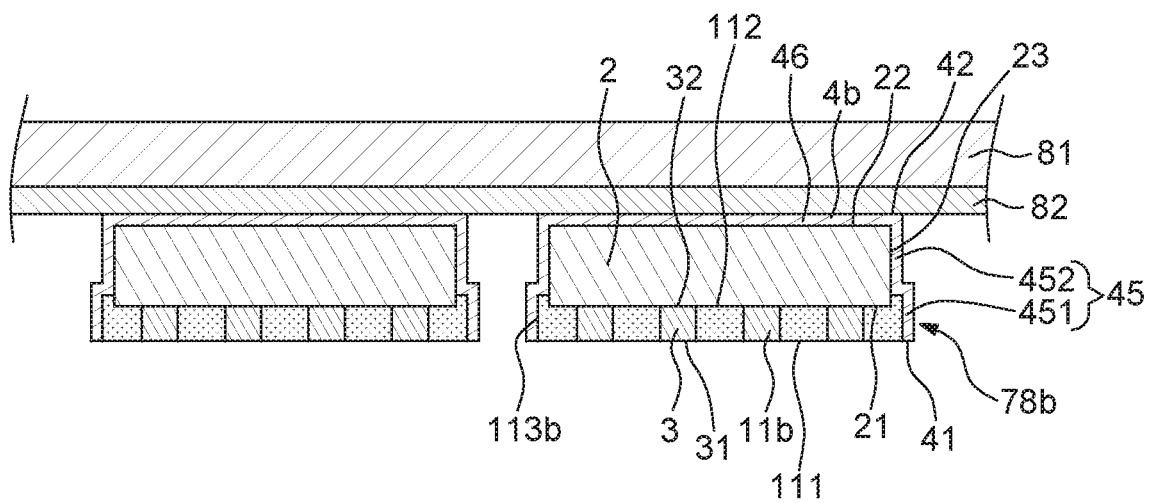
FIG. 44 illustrates one or more stages of a method for manufacturing a semiconductor package according to some embodiments of the present disclosure.

Referring to FIG. 44, the semiconductor unit 78b shown in FIG. 42, including the semiconductor element (e.g., the semiconductor die 2), the conductive bumps 3, the protection layer 11b and the shielding layer 4b, is disposed on the thermal release tape 82. FIG. 44 shows two similar semiconductor units 78b. However, more or less semiconductor units 78b may be disposed on the thermal release tape 82, and they may be the same as or different from each other. The top wall 46 of the shielding layer 4b is attached to the thermal release tape 82.

Figure 45:
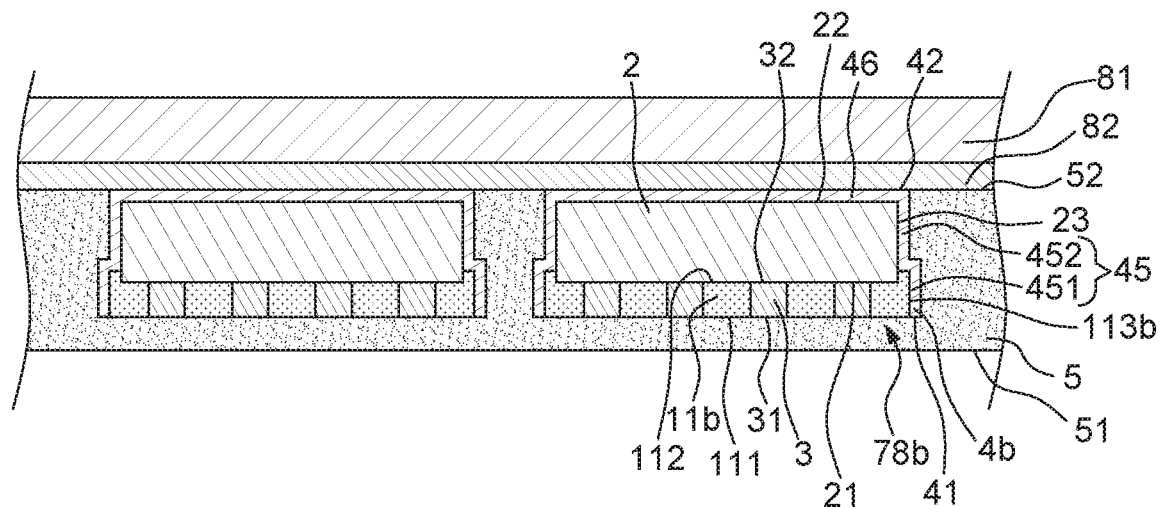
FIG. 45 illustrates one or more stages of a method for manufacturing a semiconductor package according to some embodiments of the present disclosure.

Referring to FIG. 45, an encapsulant 5 is formed or disposed on the thermal release tape 82 to cover the semiconductor unit 78b, including the semiconductor element (e.g., the semiconductor die 2), the conductive bumps 3, the protection layer 11b and the shielding layer 4b. The encapsulant 5 may be formed by a molding process. A material of the encapsulant 5 may be a molding compound with or without fillers.

Figure 46:
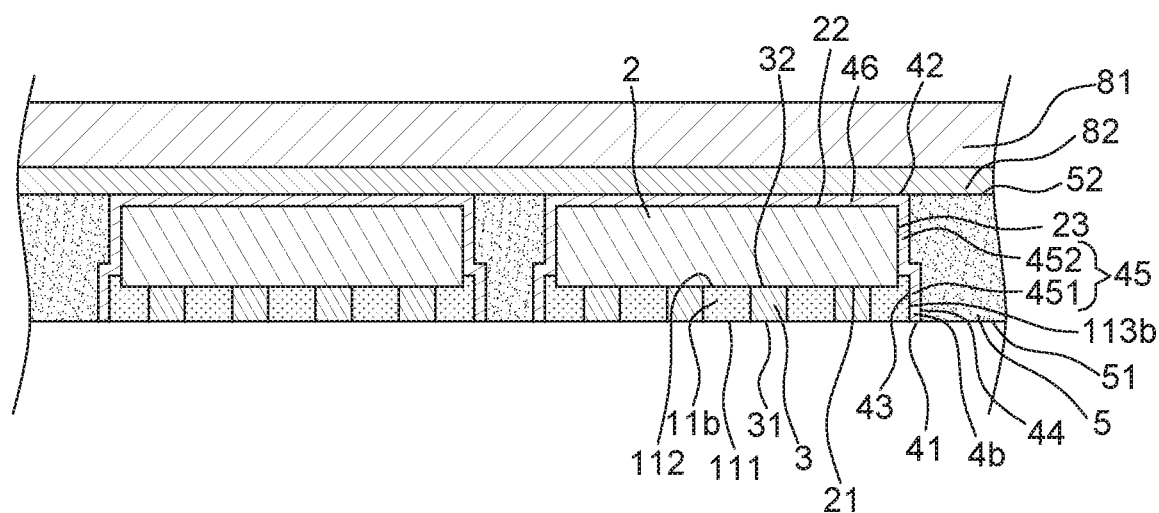
FIG. 46 illustrates one or more stages of a method for manufacturing a semiconductor package according to some embodiments of the present disclosure.

Referring to FIG. 46, a grinding process is conducted to remove a portion of the encapsulant 5. In some embodiments, the grinding process may further remove a portion of at least one of the conductive bumps 3, a portion of the shielding layer 4b and/or a portion of the protection layer 11b. The first end 31 of each of the conductive bumps 3 is exposed from the protection layer 11b, and the first end 41 of the side wall 45 of the shielding layer 4b is coplanar with the first end 31 of the conductive bumps 3. The first end 41 of the side wall 45 of the shielding layer 4b is further coplanar with the first surface 111 of the protection layer 11b. The side wall 45 of the shielding layer 4b further has an inner surface 43 and an outer surface 44. The inner surface 43 and the outer surface 44 extend between the first end 41 and the second end 42. The outer surface 44 is opposite to the inner surface 43. For example, the inner surface 43 of the first portion 451 of the sidewall 45 contacts the lateral surface 113b of the protection layer 11b, and the inner surface 43 of the second portion 452 of the sidewall 45 contacts the lateral surface 23 of the semiconductor die 2. The shielding layer 4b provides electromagnetic shielding function to the backside surface 22 and the lateral surface 23 of the semiconductor die 2. The encapsulant 5 has a first surface 51 and a second surface 52 opposite to the first surface 51. The first surface 51 of the encapsulant 5 is coplanar with the first end 31 of at least one of the conductive bumps 3, the first surface 111 of the protection layer 11b, and/or the first end 41 of the side wall 45 of the shielding layer 4b. The second surface 52 of the encapsulant 5 is coplanar with the second end 42 of the side wall 45 of the shielding layer 4b and a top surface of the top wall 46 of the shielding layer 4b.

Figure 47:
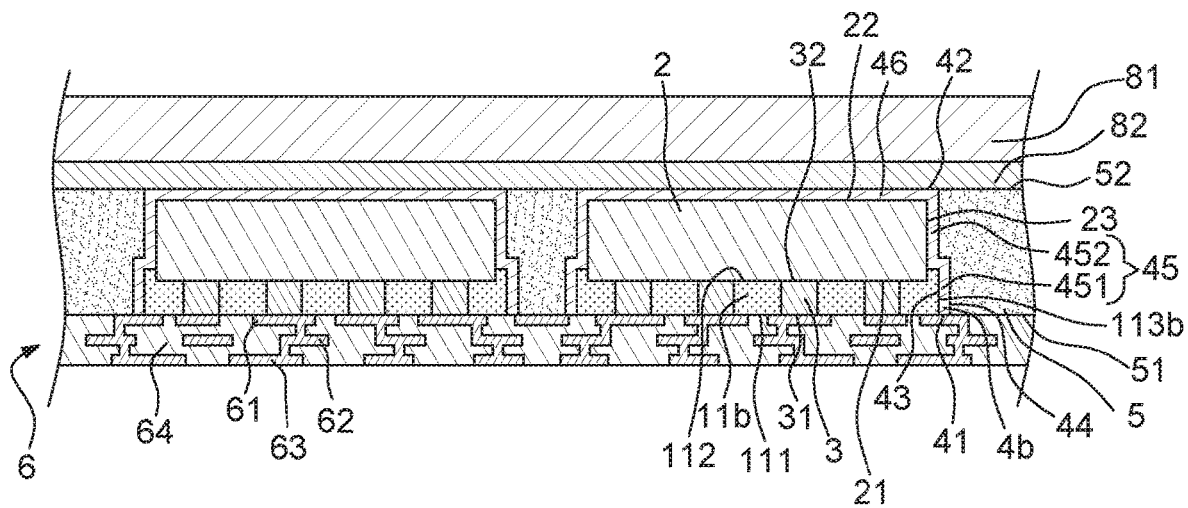
FIG. 47 illustrates one or more stages of a method for manufacturing a semiconductor package according to some embodiments of the present disclosure.

Referring to FIG. 47, a redistribution layer 6 is formed or disposed on the first surface 51 of the encapsulant 5. The redistribution layer 6 may include at least one conductive layer containing traces and pads, and may further include at least one via for connection therebetween. A line width/line space (L/S) of the redistribution layer 6 may be about 2 µm/2 µm. For example, as shown in FIG. 47, the redistribution layer 6 including three conductive layers 61, 62 and 63, which are electrically connected with each other through a plurality of vias. The redistribution layer 6 may further include an insulating structure 64 disposed between these conductive layers 61, 62 and 63. The redistribution layer 6 is electrically connected to the semiconductor die 2 through the conductive bumps 3. For example, at least one of the conductive bumps 3 contacts the topmost conductive layer 61 of the redistribution layer 6. The redistribution layer 6 is also electrically connected to the shielding layer 4b. As shown in FIG. 47, the first end 41 of the side wall 45 of the shielding layer 4b contacts the topmost conductive layer 61 of the redistribution layer 6.

Figure 48:
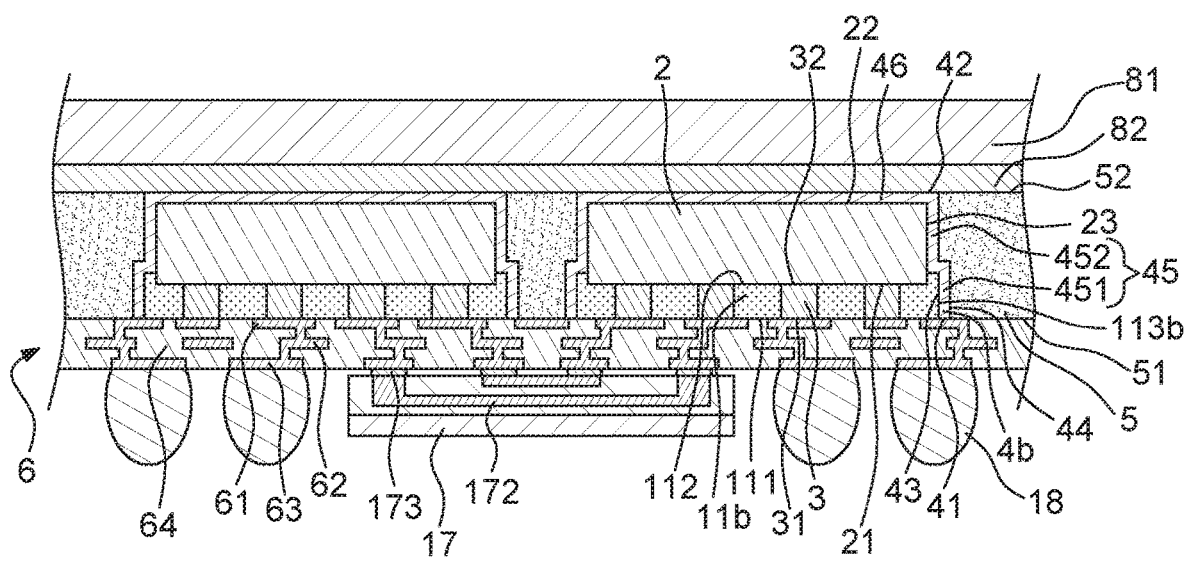
FIG. 48 illustrates one or more stages of a method for manufacturing a semiconductor package according to some embodiments of the present disclosure.

Referring to FIG. 48, an electrical component 17 and a plurality of connecting elements 18 are disposed on and electrically connected to the redistribution layer 6. The electrical component 17 may be a passive component or another semiconductor die, or an interposer. For example, as shown in FIG. 48, the electrical component 17 is a bridge connector, which includes an inner circuit 172 for electrically connecting the two semiconductor dice 2. The electrical component 17 may further include a plurality of solders 173 for electrical connection with the bottom most conductive layer 63 of the redistribution layer 6. The connecting elements 18 may be electrically connected to the bottommost conductive layer 63 of the redistribution layer 6 for external connection purpose.

Figure 49:
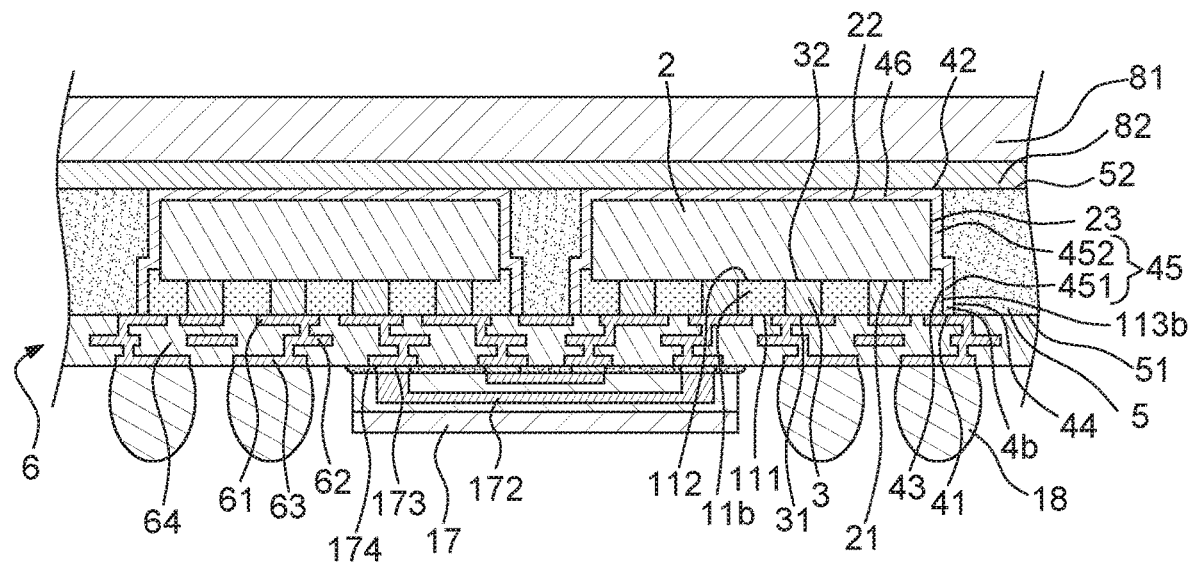
FIG. 49 illustrates one or more stages of a method for manufacturing a semiconductor package according to some embodiments of the present disclosure.

Referring to FIG. 49, an underfill 174 is disposed and filled between the electrical component 17 and the redistribution layer 6, and covers the solders 173.

Figure 50:
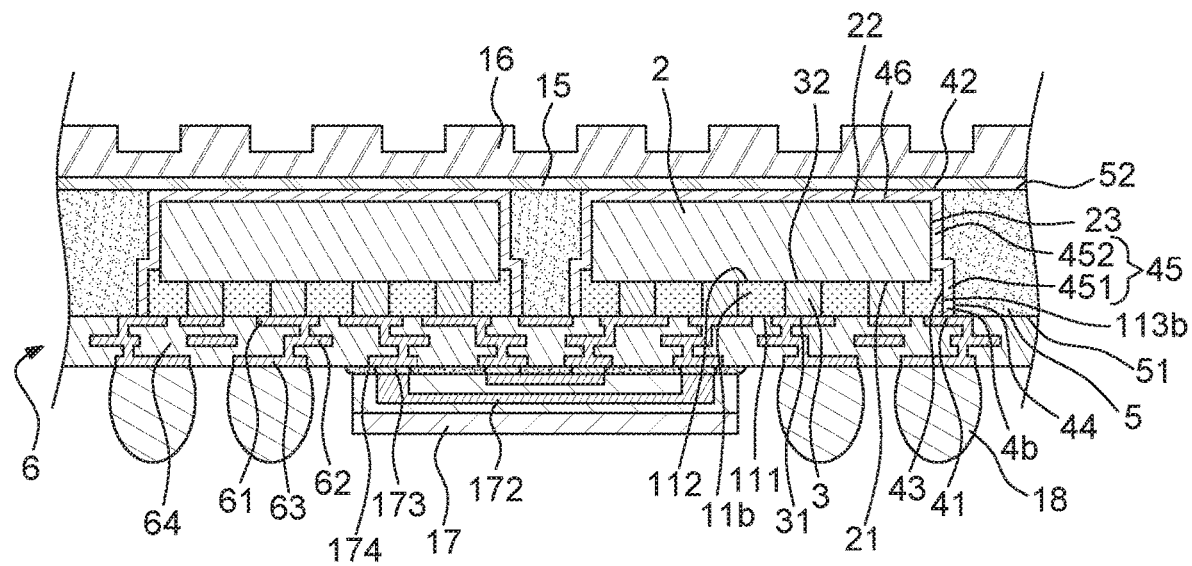
FIG. 50 illustrates one or more stages of a method for manufacturing a semiconductor package according to some embodiments of the present disclosure.

Referring to FIG. 50, the carrier 81 and the thermal release tape 82 are removed by exposing to a heat source or a UV source. Then, a heat sink 16 is attached to the second surface 52 of the encapsulant 5 through a second adhesive layer 15 for dissipation purpose. That is, the heat sink 16 is disposed adjacent to the second surface 52 of the encapsulant 5. A material of the second adhesive layer 15 may be any adhesive which is able to attach the heat sink 16 to the second surface 52 of the encapsulant 5. Then, a sawing process is conducted to cut through the heat sink 16, the second adhesive layer 15, the encapsulant 5 and the redistribution layer 6, thus forming the semiconductor package 1b as shown in FIG. 3.

Figure 51:
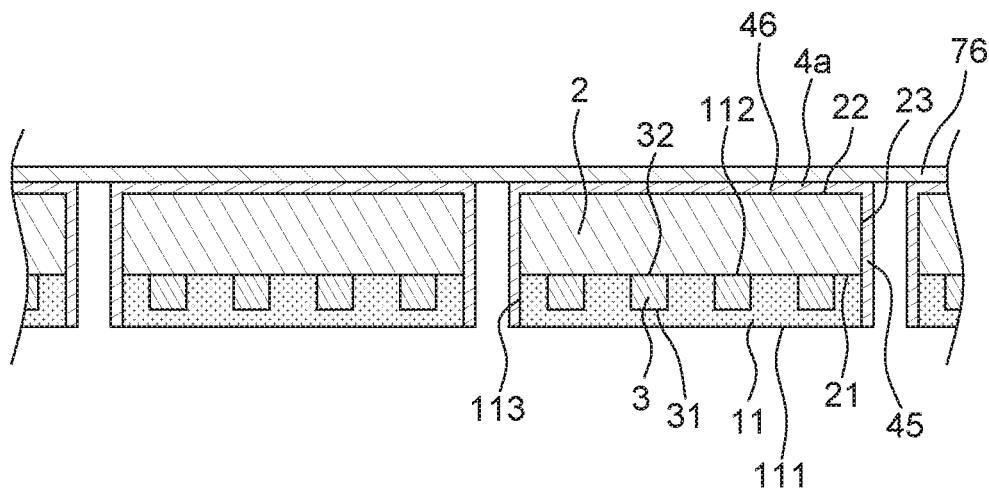
FIG. 51 illustrates one or more stages of a method for manufacturing a semiconductor package according to some embodiments of the present disclosure.

FIG. 51 through FIG. 61 illustrate a method for manufacturing a semiconductor package according to some embodiments of the present disclosure. In some embodiments, the method is for manufacturing a semiconductor package such as the semiconductor package 1c shown in FIG. 4. The initial stages of the illustrated process are the same as, or similar to, the stages illustrated in FIG. 20 through FIG. 25. However, the protection layer 11 used in the present method is removable, such as a glue which can be readily soluble in a solvent (e.g., water). FIG. 51 depicts a stage subsequent to that depicted in FIG. 25.

Referring to FIG. 51, the semiconductor dices 2 are remounted on a dicing tape 76, with the top wall 46 of the shielding layer 4a attached to the dicing tape 76.

Figure 52:
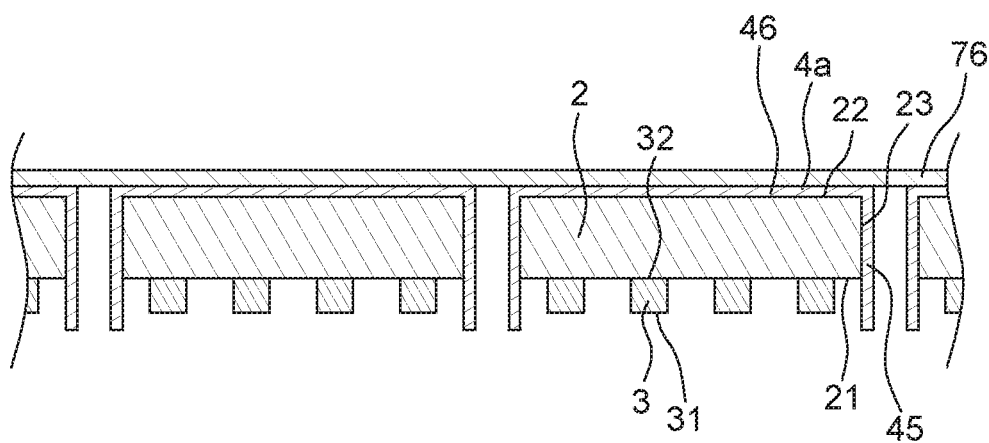
FIG. 52 illustrates one or more stages of a method for manufacturing a semiconductor package according to some embodiments of the present disclosure.

Referring to FIG. 52, the protection layer 11 is removed by a solvent, such as water. Thus, the conductive bumps 3 and the active surface 21 of the semiconductor die 2 are exposed. Then, each of the semiconductor dice 2 is picked up from the dicing tape 76, forming a semiconductor unit 78c as shown in FIG. 53.

Figure 54:
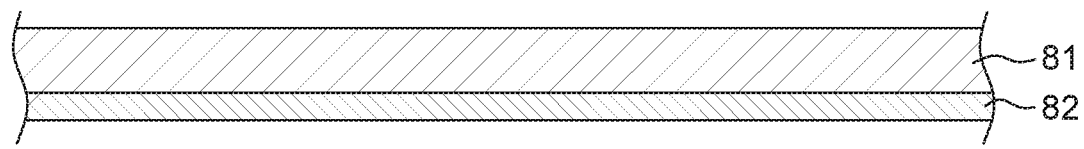
FIG. 54 illustrates one or more stages of a method for manufacturing a semiconductor package according to some embodiments of the present disclosure.

Referring to FIG. 54, a carrier 81 is provided with a thermal release tape 82 disposed thereon. The carrier 81 may be made of silicon, metal or glass, and may be the same as or different from the supporting layer 14 described above.

Figure 53:
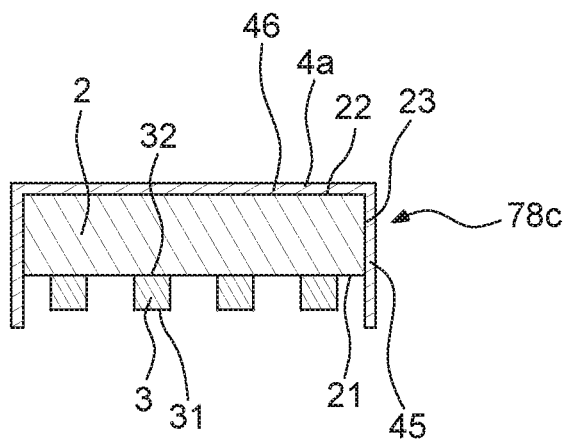
FIG. 53 illustrates one or more stages of a method for manufacturing a semiconductor package according to some embodiments of the present disclosure.
Figure 55:
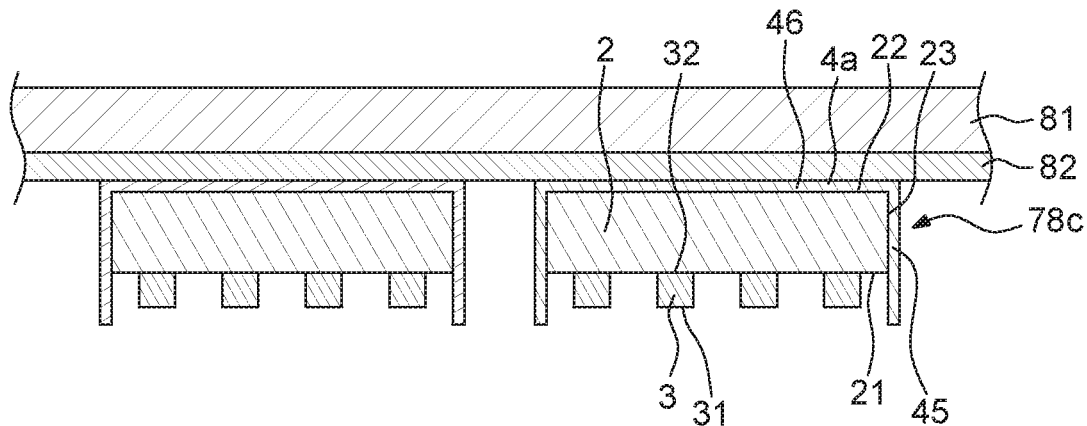
FIG. 55 illustrates one or more stages of a method for manufacturing a semiconductor package according to some embodiments of the present disclosure.

Referring to FIG. 55, the semiconductor unit 78c shown in FIG. 53, including the semiconductor die 2, the conductive bumps 3 and the shielding layer 4a, is disposed on the thermal release tape 82. FIG. 55 shows two similar semiconductor units 78c. However, more or less semiconductor units 78c may be disposed on the thermal release tape 82, and they may be the same as or different from each other. The top wall 46 of the shielding layer 4a is attached to the thermal release tape 82.

Figure 56:
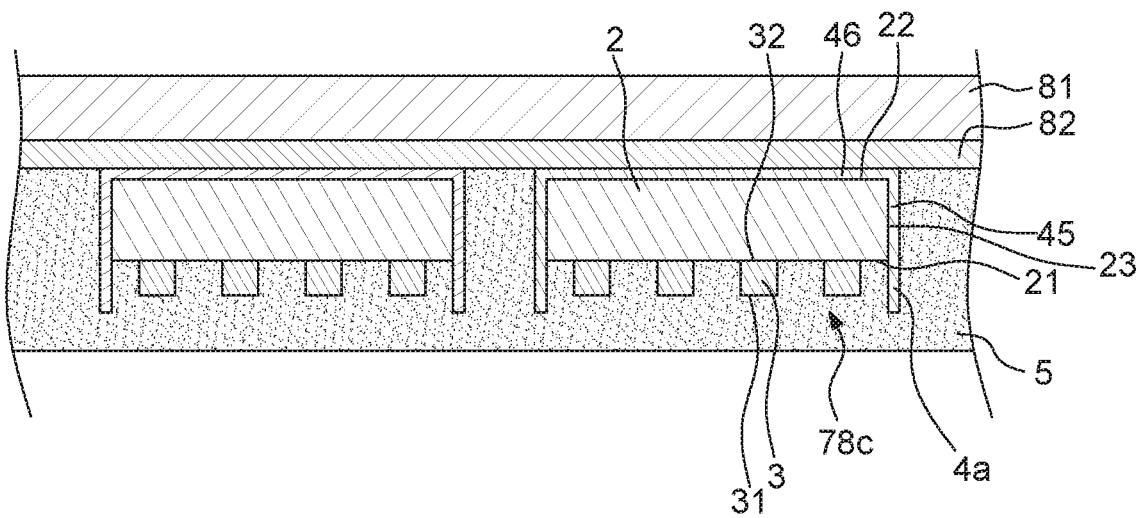
FIG. 56 illustrates one or more stages of a method for manufacturing a semiconductor package according to some embodiments of the present disclosure.

Referring to FIG. 56, an encapsulant 5 is formed or disposed on the thermal release tape 82 to cover the semiconductor unit 78c, including the semiconductor element (e.g., the semiconductor die 2), the conductive bumps 3 and the shielding layer 4a. The encapsulant 5 may be formed by a molding process. A material of the encapsulant 5 may be a molding compound with or without fillers. The encapsulant 5 is further formed on the active surface 21 of the semiconductor die 2, and covers the conductive bumps 3 disposed thereon. For example, the encapsulant 5 contacts the active surface 21 of the semiconductor die 2, and contacts and surrounds the conductive bumps 3.

Figure 57:
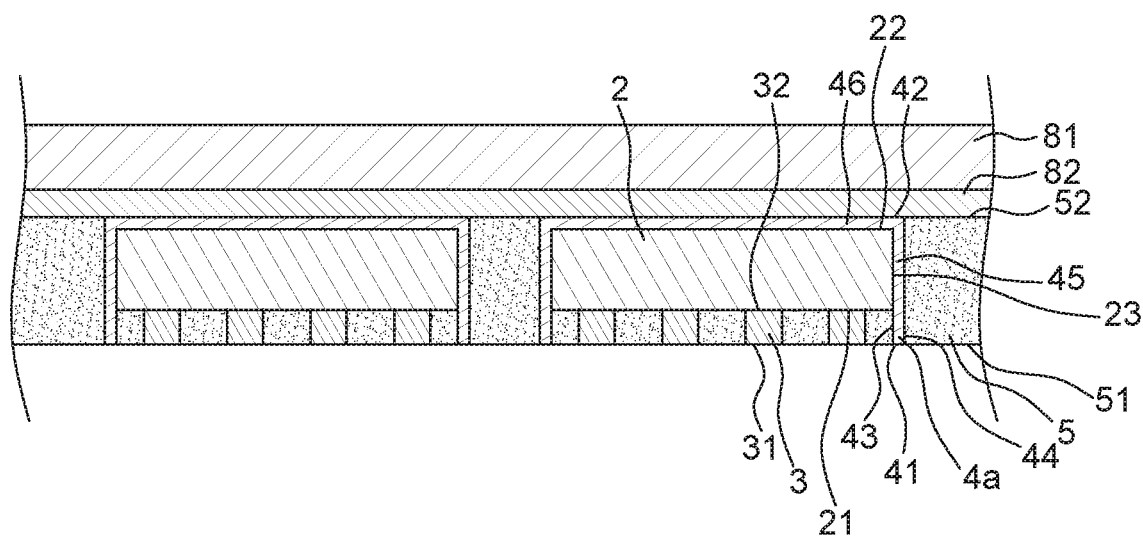
FIG. 57 illustrates one or more stages of a method for manufacturing a semiconductor package according to some embodiments of the present disclosure.

Referring to FIG. 57, a grinding process is conducted to remove a portion of the encapsulant 5 and a portion of the shielding layer 4a. In some embodiments, the grinding process may further remove a portion of at least one of the conductive bumps 3. As such, the first end 31 of each of the conductive bumps 3 may be exposed from the encapsulant 5, and a first end 41 of the side wall 45 of the shielding layer 4a is formed coplanar with the first end 31 of the conductive bumps 3. The side wall 45 of the shielding layer 4a further has a second end 42, an inner surface 43 and an outer surface 44. The second end 42 is opposite to the first end 41. The top wall 46 is connected to the second end 42 of the side wall 45. The inner surface 43 and the outer surface 44 extend between the first end 41 and the second end 42. The outer surface 44 is opposite to the inner surface 43. For example, the inner surface 43 of the sidewall 45 of the shielding layer 4a contacts the lateral surface 23 of the semiconductor die 2. The shielding layer 4a provides electromagnetic shielding function to the backside surface 22 and the lateral surface 23 of the semiconductor die 2. The encapsulant 5 has a first surface 51 and a second surface 52 opposite to the first surface 51. The first surface 51 of the encapsulant 5 is coplanar with the first end 31 of at least one of the conductive bumps 3 and/or the first end 41 of the shielding layer 4. The second surface 52 of the encapsulant 5 is coplanar with the second end 42 of the shielding layer 4a and a top surface of the top wall 46 of the shielding layer 4a.

Figure 58:
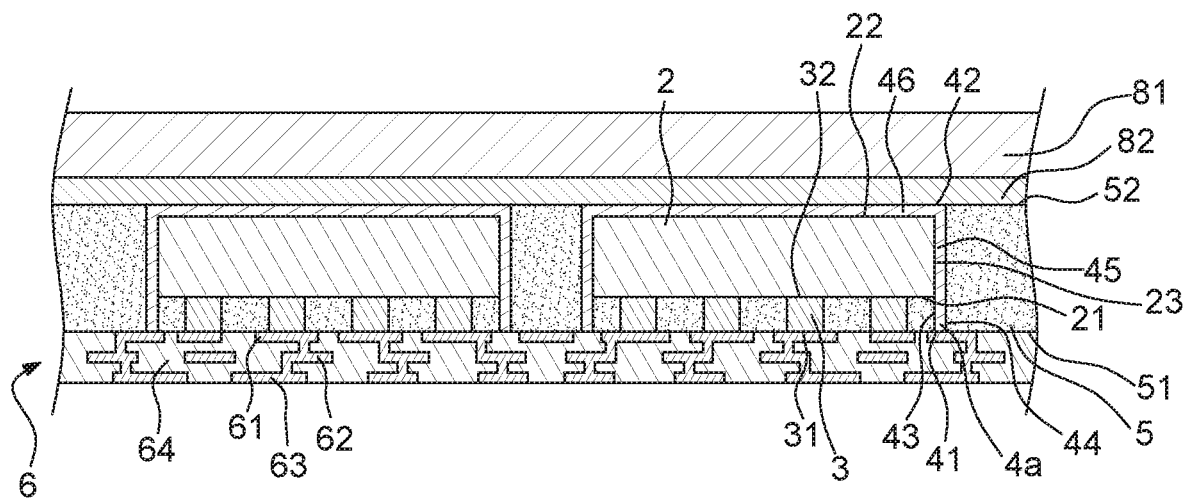
FIG. 58 illustrates one or more stages of a method for manufacturing a semiconductor package according to some embodiments of the present disclosure.

Referring to FIG. 58, a redistribution layer 6 is formed or disposed on the first surface 51 of the encapsulant 5. The redistribution layer 6 may include at least one conductive layer containing traces and pads, and may further include at least one via for connection therebetween. A line width/line space (L/S) of the redistribution layer 6 may be about 2 µm/2 µm. For example, as shown in FIG. 58, the redistribution layer 6 including three conductive layers 61, 62 and 63, which are electrically connected with each other through a plurality of vias. The redistribution layer 6 may further include an insulating structure 64 disposed between these conductive layers 61, 62 and 63. The redistribution layer 6 is electrically connected to the semiconductor die 2 through the conductive bumps 3. For example, at least one of the conductive bumps 3 contacts the topmost conductive layer 61 of the redistribution layer 6. The redistribution layer 6 is also electrically connected to the shielding layer 4a. As shown in FIG. 58, the first end 41 of the side wall 45 of the shielding layer 4a contacts the topmost conductive layer 61 of the redistribution layer 6.

Figure 59:
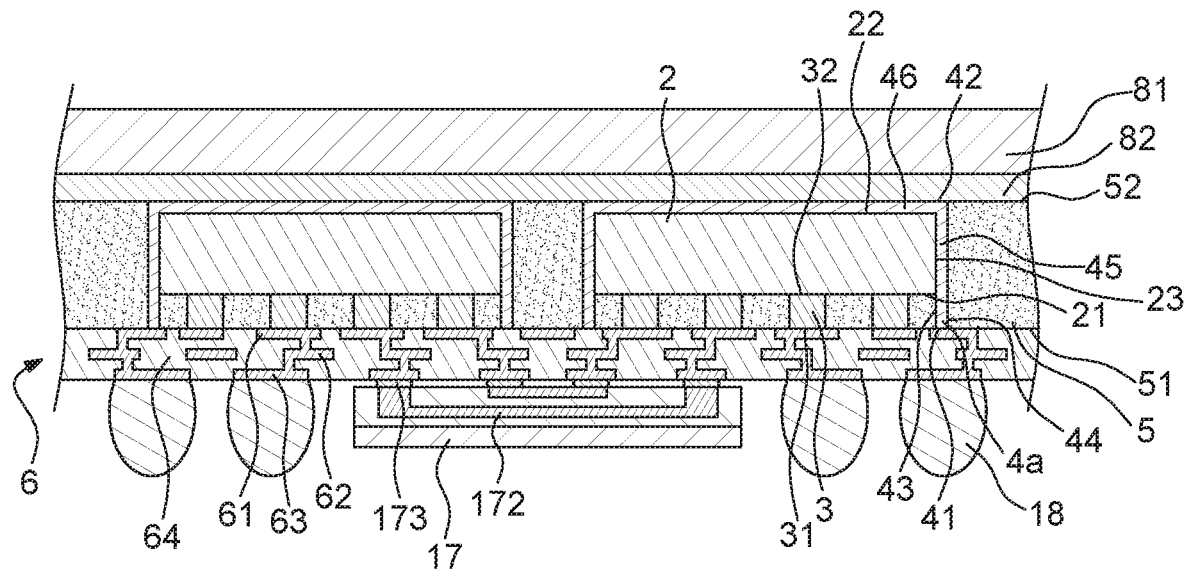
FIG. 59 illustrates one or more stages of a method for manufacturing a semiconductor package according to some embodiments of the present disclosure.

Referring to FIG. 59, an electrical component 17 and a plurality of connecting elements 18 are disposed on and electrically connected to the redistribution layer 6. The electrical component 17 may be a passive component or another semiconductor die, or an interposer. For example, as shown in FIG. 59, the electrical component 17 is a bridge connector, which includes an inner circuit 172 for electrically connecting the two semiconductor dice 2. The electrical component 17 may further include a plurality of solders 173 for electrical connection with the bottom most conductive layer 63 of the redistribution layer 6. The connecting elements 18 may be electrically connected to the bottommost conductive layer 63 of the redistribution layer 6 for external connection purpose.

Figure 60:
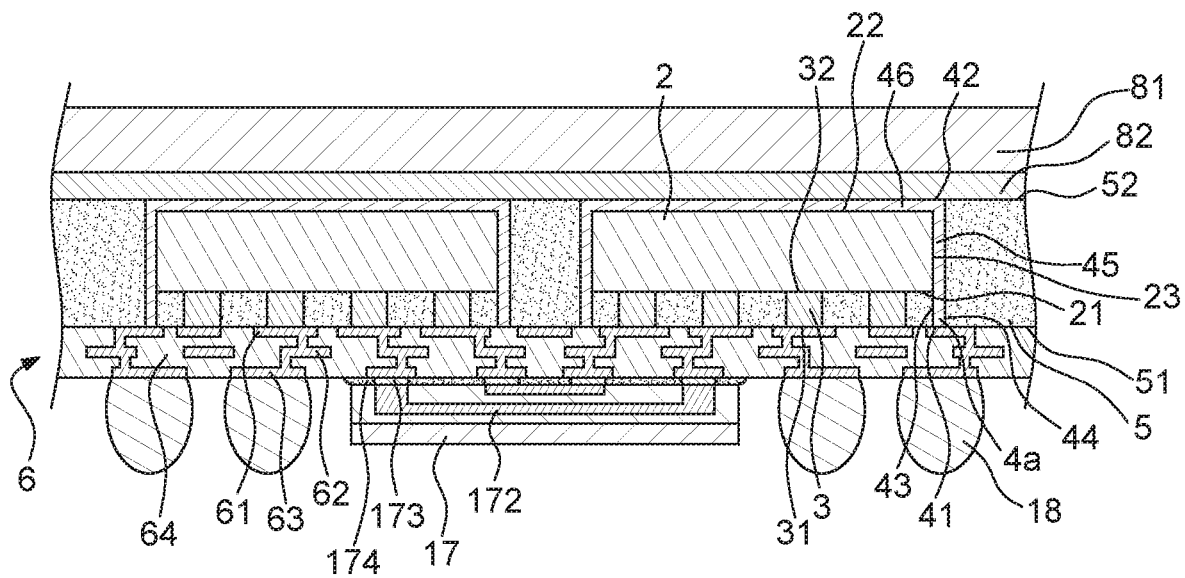
FIG. 60 illustrates one or more stages of a method for manufacturing a semiconductor package according to some embodiments of the present disclosure.

Referring to FIG. 60, an underfill 174 is disposed and filled between the electrical component 17 and the redistribution layer 6, and covers the solders 173.

Figure 61:
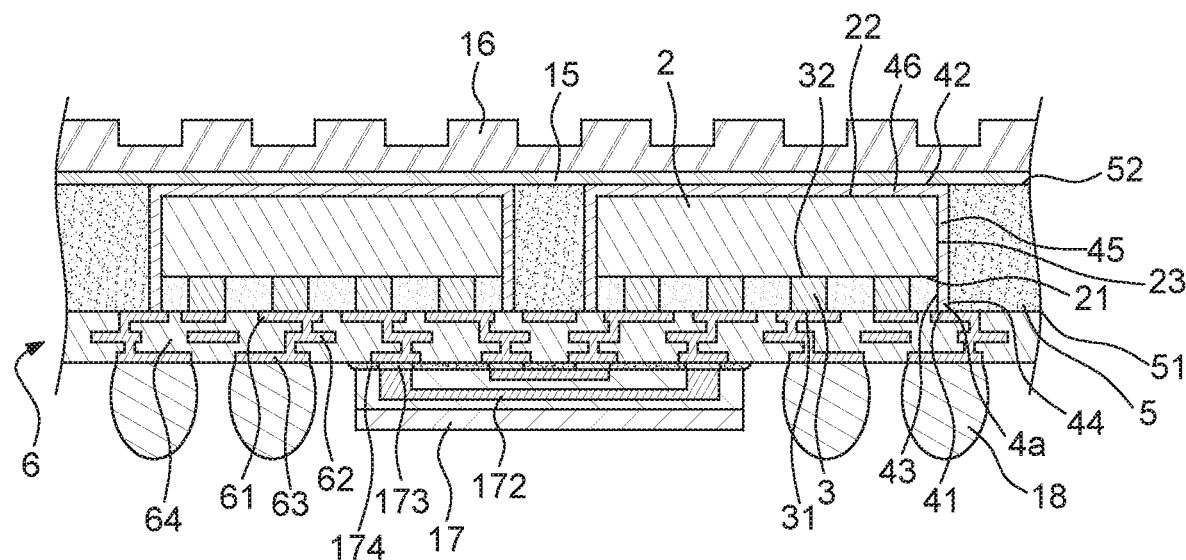
FIG. 61 illustrates one or more stages of a method for manufacturing a semiconductor package according to some embodiments of the present disclosure.

Referring to FIG. 61, the carrier 81 and the thermal release tape 82 are removed by exposing to a heat source or a UV source. Then, a heat sink 16 is attached to the second surface 52 of the encapsulant 5 through a second adhesive layer 15 for dissipation purpose. That is, the heat sink 16 is disposed adjacent to the second surface 52 of the encapsulant 5. A material of the second adhesive layer 15 may be any adhesive which is able to attach the heat sink 16 to the second surface 52 of the encapsulant 5. Then, a sawing process is conducted to cut through the heat sink 16, the second adhesive layer 15, the encapsulant 5 and the redistribution layer 6, thus forming the semiconductor package 1c as shown in FIG. 4.

Figure 62:
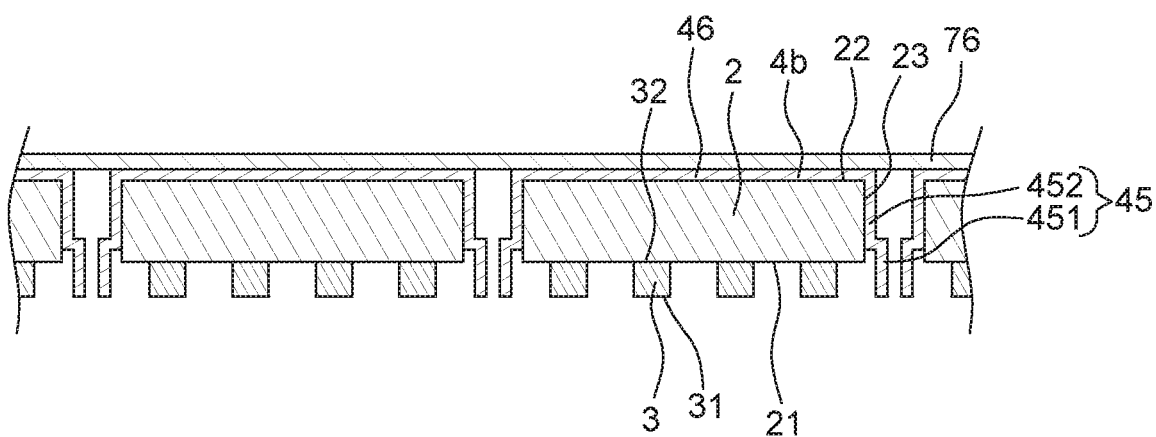
FIG. 62 illustrates one or more stages of a method for manufacturing a semiconductor package according to some embodiments of the present disclosure.

FIG. 62 through FIG. 71 illustrate a method for manufacturing a semiconductor package according to some embodiments of the present disclosure. In some embodiments, the method is for manufacturing a semiconductor package such as the semiconductor package 1d shown in FIG. 5. The initial stages of the illustrated process are the same as, or similar to, the stages illustrated in FIG. 35 through FIG. 41. However, the protection material 74 used in the present method is removable, such as a glue which can be readily soluble in a solvent (e.g., water). Accordingly, the protection layer 11b formed therefrom is also removable. FIG. 62 depicts a stage subsequent to that depicted in FIG. 41.

Referring to FIG. 62, the protection layer 11b is removed by a solvent, such as water. Thus, the conductive bumps 3 and the active surface 21 of the semiconductor die 2 are exposed. Then, each of the semiconductor dice 2 is picked up from the dicing tape 76, forming a semiconductor unit 78d as shown in FIG. 63.

Figure 64:
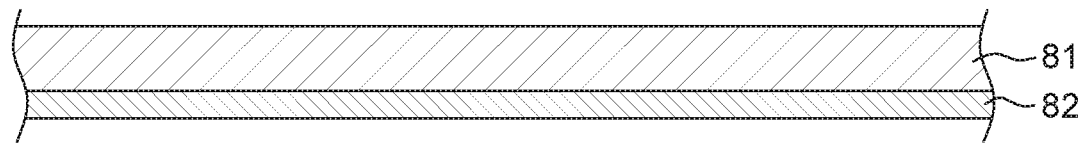
FIG. 64 illustrates one or more stages of a method for manufacturing a semiconductor package according to some embodiments of the present disclosure.

Referring to FIG. 64, a carrier 81 is provided with a thermal release tape 82 disposed thereon. The carrier 81 may be made of silicon, metal or glass, and may be the same as or different from the supporting layer 14 described above.

Figure 63:
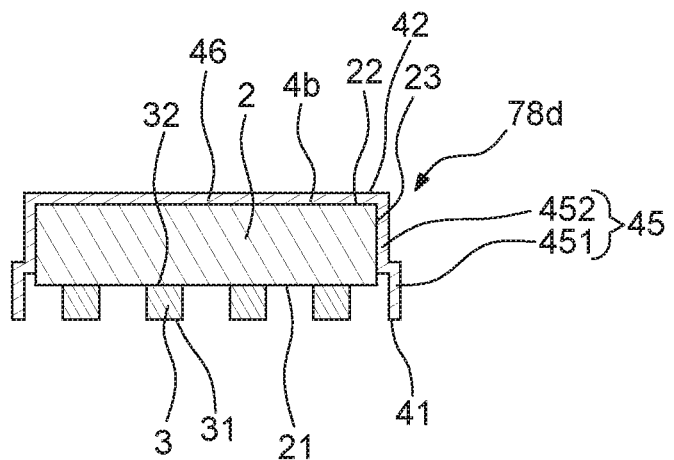
FIG. 63 illustrates one or more stages of a method for manufacturing a semiconductor package according to some embodiments of the present disclosure.
Figure 65:
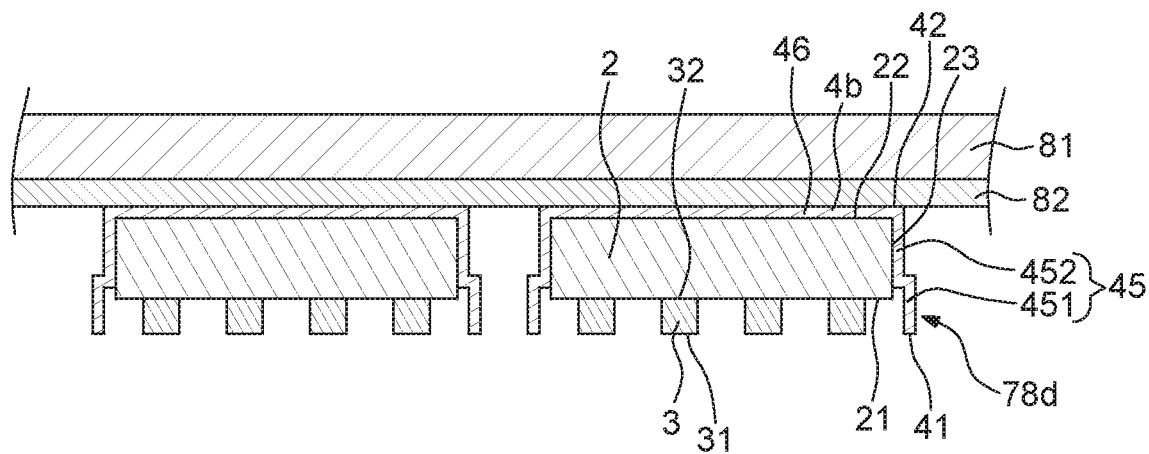
FIG. 65 illustrates one or more stages of a method for manufacturing a semiconductor package according to some embodiments of the present disclosure.

Referring to FIG. 65, the semiconductor unit 78d shown in FIG. 63, including the semiconductor die 2, the conductive bumps 3 and the shielding layer 4b, is disposed on the thermal release tape 82. FIG. 65 shows two similar semiconductor units 78d. However, more or less semiconductor units 78d may be disposed on the thermal release tape 82, and they may be the same as or different from each other. The top wall 46 of the shielding layer 4a is attached to the thermal release tape 82.

Figure 66:
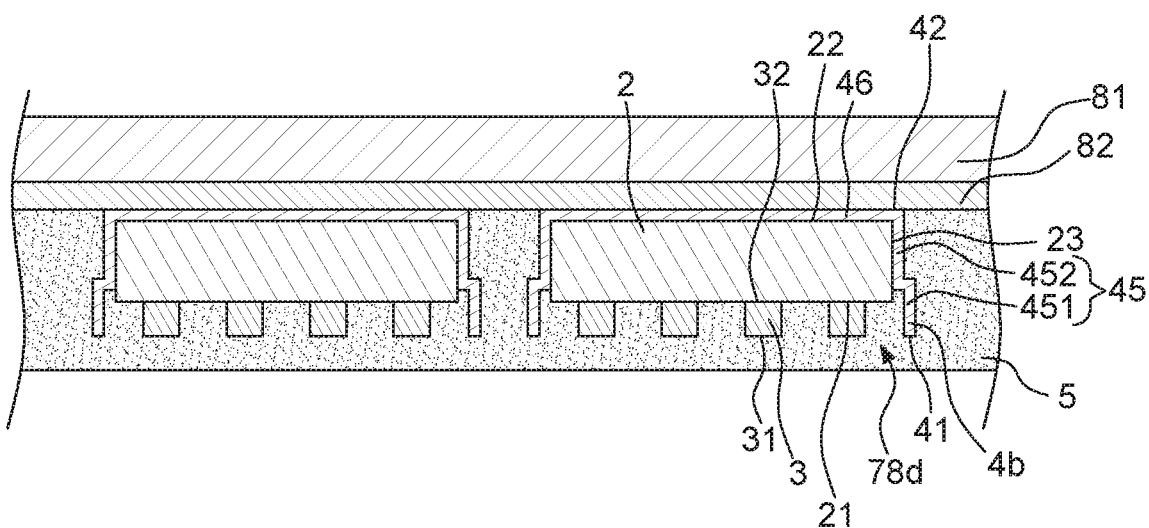
FIG. 66 illustrates one or more stages of a method for manufacturing a semiconductor package according to some embodiments of the present disclosure.

Referring to FIG. 66, an encapsulant 5 is formed or disposed on the thermal release tape 82 to cover the semiconductor unit 78d, including the semiconductor element (e.g., the semiconductor die 2), the conductive bumps 3 and the shielding layer 4b. The encapsulant 5 may be formed by a molding process. A material of the encapsulant 5 may be a molding compound with or without fillers. The encapsulant 5 is further formed on the active surface 21 of the semiconductor die 2, and covers the conductive bumps 3 disposed thereon. For example, the encapsulant 5 contacts the active surface 21 of the semiconductor die 2, and contacts and surrounds the conductive bumps 3.

Figure 67:
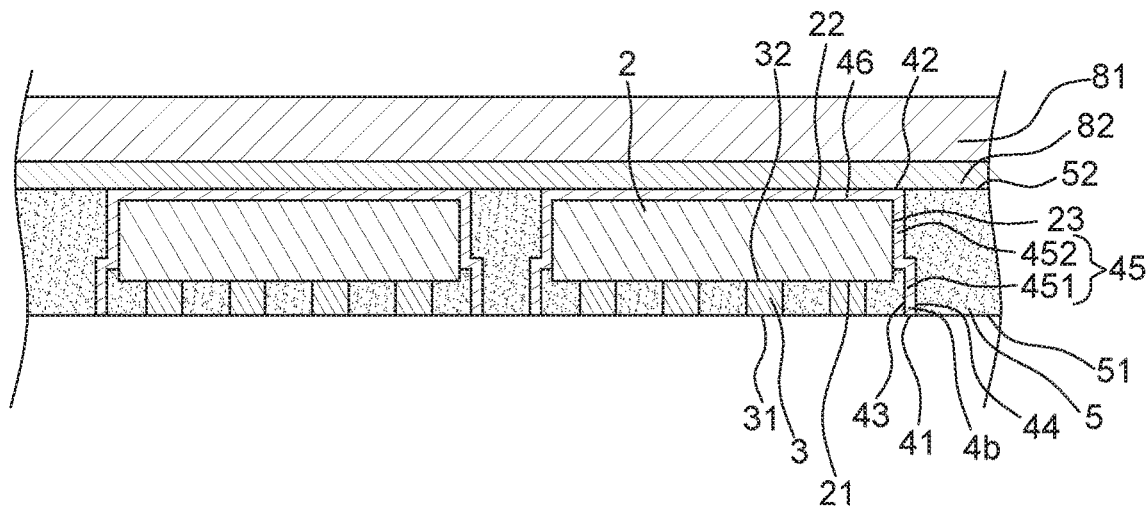
FIG. 67 illustrates one or more stages of a method for manufacturing a semiconductor package according to some embodiments of the present disclosure.

Referring to FIG. 67, a grinding process is conducted to remove a portion of the encapsulant 5. In some embodiments, the grinding process may further remove a portion of at least one of the conductive bumps 3 and/or a portion of the shielding layer 4b. As such, the first end 31 of each of the conductive bumps 3 is exposed from the encapsulant 5. The first end 41 of the side wall 45 of the shielding layer 4b is coplanar with the first end 31 of the conductive bumps 3. The side wall 45 of the shielding layer 4b further has an inner surface 43 and an outer surface 44. The inner surface 43 and the outer surface 44 extend between the first end 41 and the second end 42. The outer surface 44 is opposite to the inner surface 43. For example, the inner surface 43 of the second portion 452 of the sidewall 45 contacts the lateral surface 23 of the semiconductor die 2. The shielding layer 4b provides electromagnetic shielding function to the backside surface 22 and the lateral surface 23 of the semiconductor die 2. The encapsulant 5 has a first surface 51 and a second surface 52 opposite to the first surface 51. The first surface 51 of the encapsulant 5 is coplanar with the first end 31 of at least one of the conductive bumps 3 and/or the first end 41 of the side wall 45 of the shielding layer 4b. The second surface 52 of the encapsulant 5 is coplanar with the second end 42 of the side wall 45 of the shielding layer 4b and a top surface of the top wall 46 of the shielding layer 4b.

Figure 68:
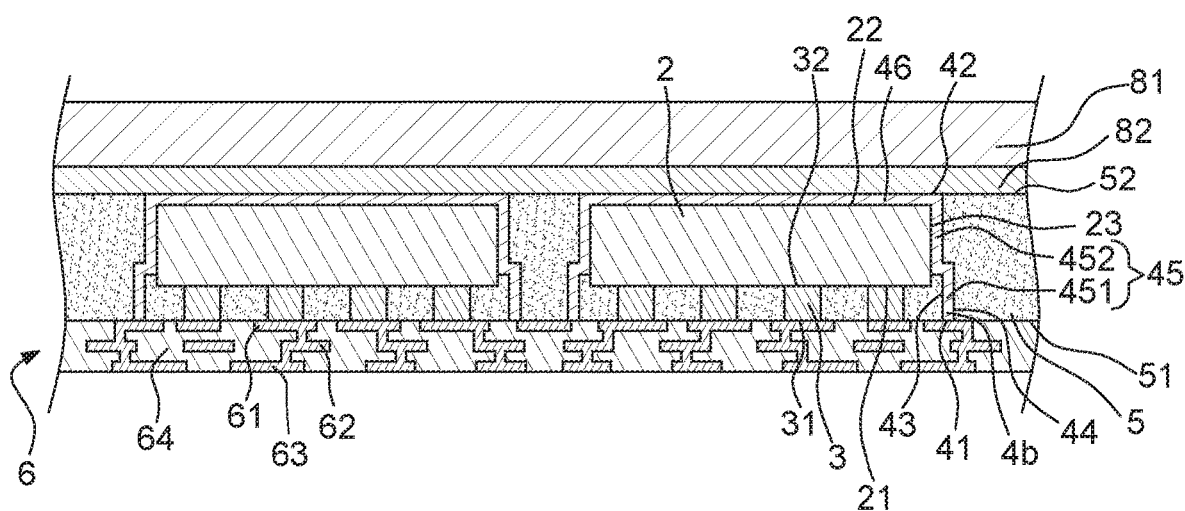
FIG. 68 illustrates one or more stages of a method for manufacturing a semiconductor package according to some embodiments of the present disclosure.

Referring to FIG. 68, a redistribution layer 6 is formed or disposed on the first surface 51 of the encapsulant 5. The redistribution layer 6 may include at least one conductive layer containing traces and pads, and may further include at least one via for connection therebetween. A line width/line space (L/S) of the redistribution layer 6 may be about 2 μm/2 μm. For example, as shown in FIG. 68, the redistribution layer 6 including three conductive layers 61, 62 and 63, which are electrically connected with each other through a plurality of vias. The redistribution layer 6 may further include an insulating structure 64 disposed between these conductive layers 61, 62 and 63. The redistribution layer 6 is electrically connected to the semiconductor die 2 through the conductive bumps 3. For example, at least one of the conductive bumps 3 contacts the topmost conductive layer 61 of the redistribution layer 6. The redistribution layer 6 is also electrically connected to the shielding layer 4b. As shown in FIG. 68, the first end 41 of the side wall 45 of the shielding layer 4b contacts the topmost conductive layer 61 of the redistribution layer 6.

Figure 69:
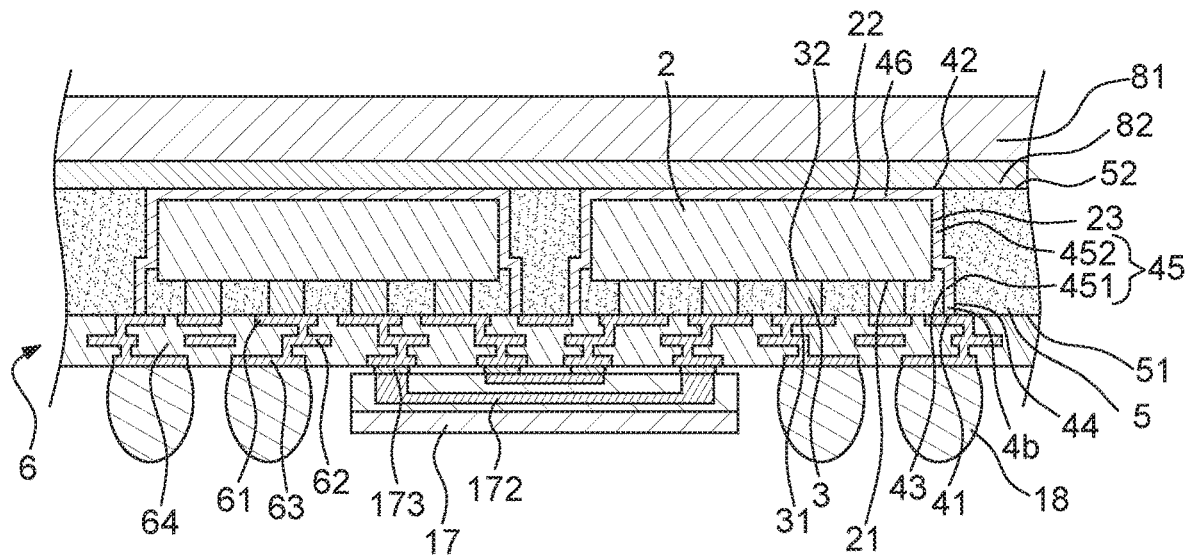
FIG. 69 illustrates one or more stages of a method for manufacturing a semiconductor package according to some embodiments of the present disclosure.

Referring to FIG. 69, an electrical component 17 and a plurality of connecting elements 18 are disposed on and electrically connected to the redistribution layer 6. The electrical component 17 may be a passive component or another semiconductor die, or an interposer. For example, as shown in FIG. 69, the electrical component 17 is a bridge connector, which includes an inner circuit 172 for electrically connecting the two semiconductor dice 2. The electrical component 17 may further include a plurality of solders 173 for electrical connection with the bottom most conductive layer 63 of the redistribution layer 6. The connecting elements 18 may be electrically connected to the bottom-most conductive layer 63 of the redistribution layer 6 for external connection purpose.

Figure 70:
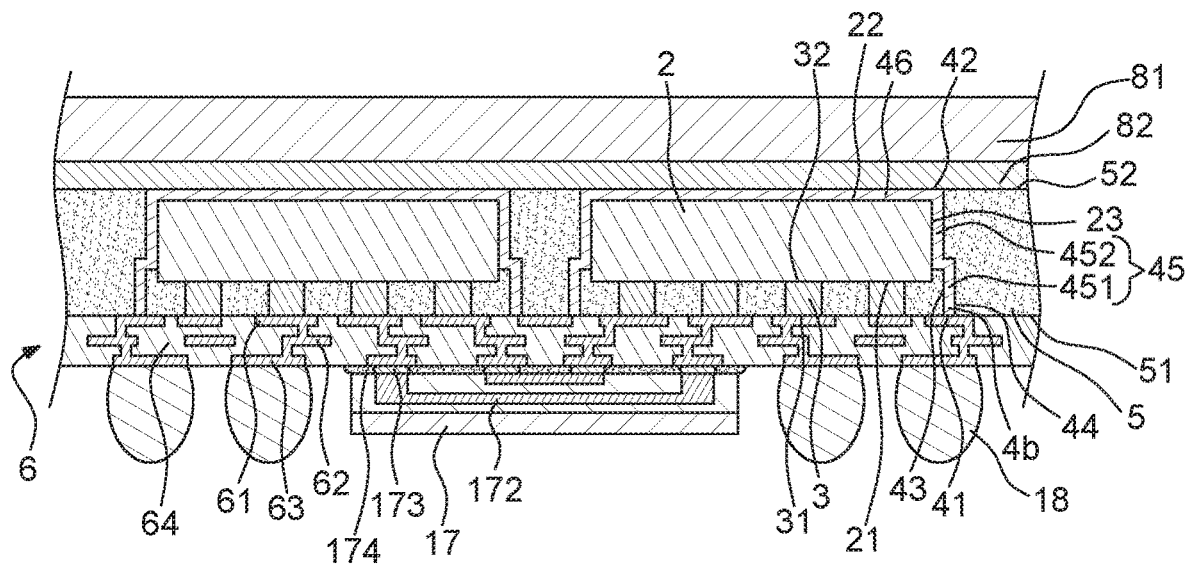
FIG. 70 illustrates one or more stages of a method for manufacturing a semiconductor package according to some embodiments of the present disclosure.

Referring to FIG. 70, an underfill 174 is disposed and filled between the electrical component 17 and the redistribution layer 6, and covers the solders 173.

Figure 71:
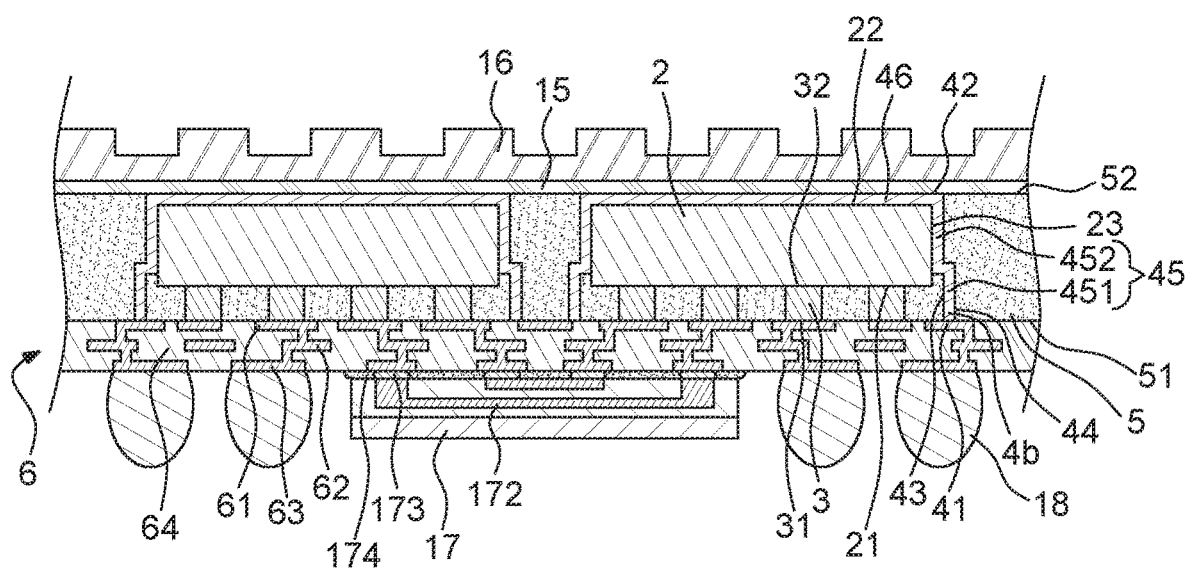
FIG. 71 illustrates one or more stages of a method for manufacturing a semiconductor package according to some embodiments of the present disclosure.

Referring to FIG. 71, the carrier 81 and the thermal release tape 82 are removed by exposing to a heat source or a UV source. Then, a heat sink 16 is attached to the second surface 52 of the encapsulant 5 through a second adhesive layer 15 for dissipation purpose. That is, the heat sink 16 is disposed adjacent to the second surface 52 of the encapsulant 5. A material of the second adhesive layer 15 may be any adhesive which is able to attach the heat sink 16 to the second surface 52 of the encapsulant 5. Then, a sawing process is conducted to cut through the heat sink 16, the second adhesive layer 15, the encapsulant 5 and the redistribution layer 6, thus forming the semiconductor package 1d as shown in FIG. 5.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
    a semiconductor die having an active surface, a backside surface and a lateral surface;
    a plurality of conductive bumps disposed on the active surface of the semiconductor die;
    a shielding layer disposed on the lateral surface of the semiconductor die;
    an encapsulant covering the shielding layer, and having a first surface and a second surface opposite to the first surface; and
    a redistribution layer disposed on the first surface of the encapsulant, and electrically connected to the semiconductor die through the conductive bumps, wherein the shielding layer is electrically connected to the redistribution layer.

2. The semiconductor package of claim 1, wherein an end of the shielding layer is coplanar with an end of each of the conductive bumps.

3. The semiconductor package of claim 1, wherein an end of the shielding layer contacts the redistribution layer.

4. The semiconductor package of claim 1, wherein the encapsulant covers the conductive bumps.

5. The semiconductor package of claim 1, further comprising a protection layer covering the conductive bumps.

6. The semiconductor package of claim 5, wherein an end of the shielding layer is coplanar with a surface of the protection layer.

7. The semiconductor package of claim 5, wherein the shielding layer covers a lateral surface of the protection layer.

8. The semiconductor package of claim 1, further comprising a metal layer disposed on the second surface of the encapsulant.

9. The semiconductor package of claim 8, further comprising a supporting layer disposed on the metal layer.

10. The semiconductor package of claim 9, further comprising a first adhesive layer disposed on the backside surface of the semiconductor die.

11. The semiconductor package of claim 10, wherein the shielding layer covers a lateral surface of the first adhesive layer.

12. The semiconductor package of claim 1, further comprising a heat sink disposed adjacent the second surface of the encapsulant.

13. The semiconductor package of claim 1, further comprising an electrical component electrically connected to the redistribution layer.

14. The semiconductor package of claim 1, the shielding layer is further disposed on the backside surface of the semiconductor die.

15. The semiconductor package of claim 5, wherein a lateral surface of the protection layer is not coplanar with the lateral surface of the semiconductor die.

16. The semiconductor package of claim 15, wherein the protection layer covers a portion of the lateral surface of the semiconductor die.

17. The semiconductor package of claim 16, wherein the shielding layer comprises a side wall, and the side wall comprises a first portion disposed on the lateral surface of the protection layer and a second portion disposed on the lateral surface of the semiconductor die.

18. The semiconductor package of claim 9, wherein the supporting layer is a carrier, and the metal layer is a copper foil disposed on the carrier.

19. The semiconductor package of claim 10, wherein a surface of the first adhesive layer is coplanar with the second surface of the encapsulant.

20. The semiconductor package of claim 10, wherein the first adhesive layer is a portion of a die attach film.

* * * * *